US008318237B2

(12) United States Patent
Kinoshita

(10) Patent No.: US 8,318,237 B2
(45) Date of Patent: Nov. 27, 2012

(54) PIXEL OBSERVATION SYSTEM, DRAWING SYSTEM, LIQUID MATERIAL DRAWING METHOD, COLOR FILTER MANUFACTURING METHOD, AND ORGANIC EL ELEMENT MANUFACTURING METHOD

(75) Inventor: Toyotaro Kinoshita, Mie (JP)

(73) Assignee: Seiko Epson Corporation, Tokyo (JP)

( * ) Notice: Subject to any disclaimer, the term of this patent is extended or adjusted under 35 U.S.C. 154(b) by 1391 days.

(21) Appl. No.: 11/950,858

(22) Filed: Dec. 5, 2007

(65) Prior Publication Data

US 2008/0139072 A1 Jun. 12, 2008

(30) Foreign Application Priority Data

Dec. 12, 2006 (JP) ................................. 2006-334154

(51) Int. Cl.
B05D 1/00 (2006.01)
B05D 5/06 (2006.01)
B05D 5/12 (2006.01)

(52) U.S. Cl. .................. 427/8; 427/66; 427/74; 427/77

(58) Field of Classification Search .................. 427/66, 427/74, 77, 8; 347/19, 9
See application file for complete search history.

(56) References Cited

FOREIGN PATENT DOCUMENTS

| JP | 2003-275650 A | 9/2003 |
|----|---------------|--------|
| JP | 2004-253332 A | 9/2004 |
| JP | 2006-130383 A | 5/2006 |
| JP | 2006-239570 A | 9/2006 |
| JP | 2006-330690 A | 12/2006 |

*Primary Examiner* — Leo B Tentoni
(74) *Attorney, Agent, or Firm* — Global IP Counselors, LLP

(57) ABSTRACT

A pixel observation system includes a memory unit, a coordinate generation unit, and an observation unit. The memory unit is configured to store at least nozzle information indicative of discharge states of a liquid material in a plurality of nozzles and arrangement information indicative of an arrangement of each of the nozzles with respect to each of a plurality of pixel regions in relative movement of the nozzles and a substrate. The coordinate generation unit is configured to generate observation coordinates of observation regions on the substrate based on the nozzle information and the arrangement information, and to include coordinates of at least some of the pixel regions over which the nozzles scan through one cycle of the relative movement in the observation coordinates. The observation unit is configured and arranged to observe the pixel regions positioned at the observation coordinates generated by the coordinate generation unit.

10 Claims, 16 Drawing Sheets

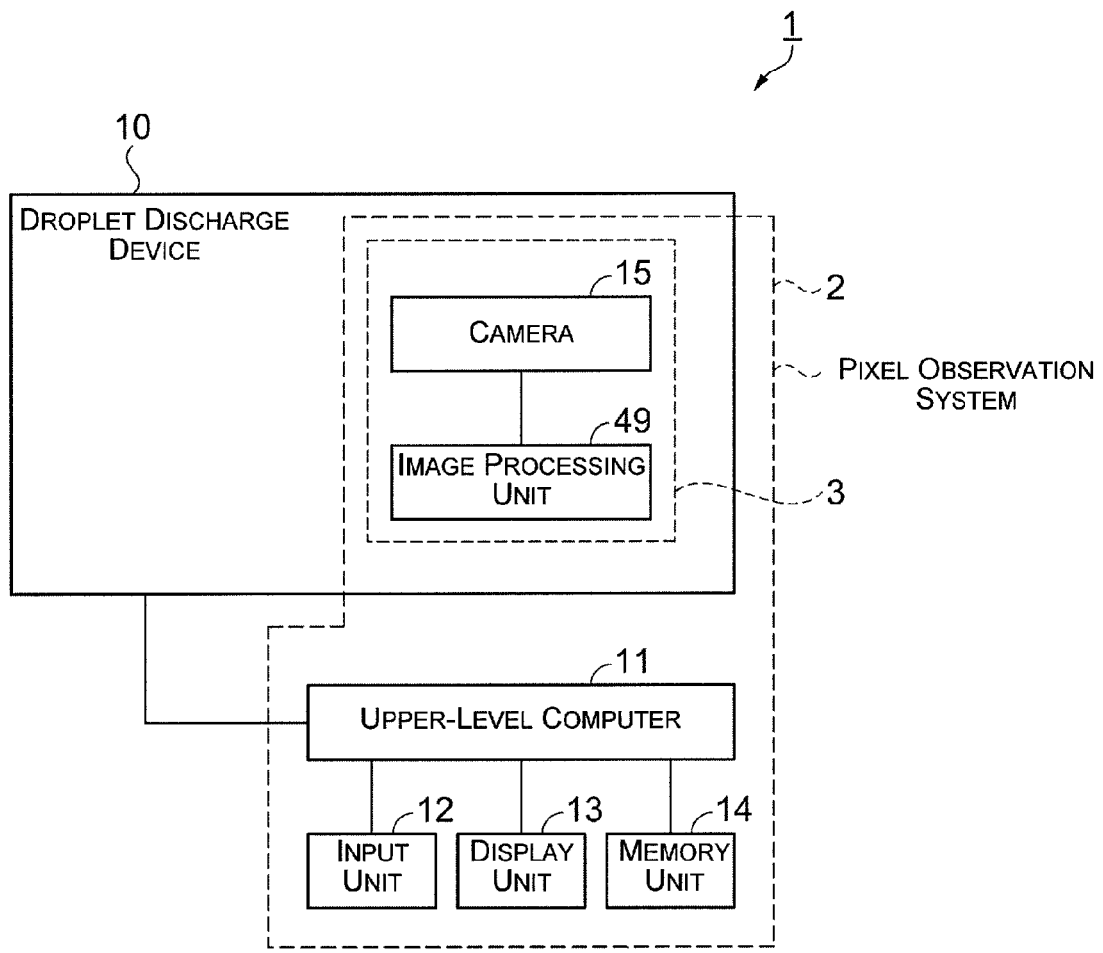
F I G. 1

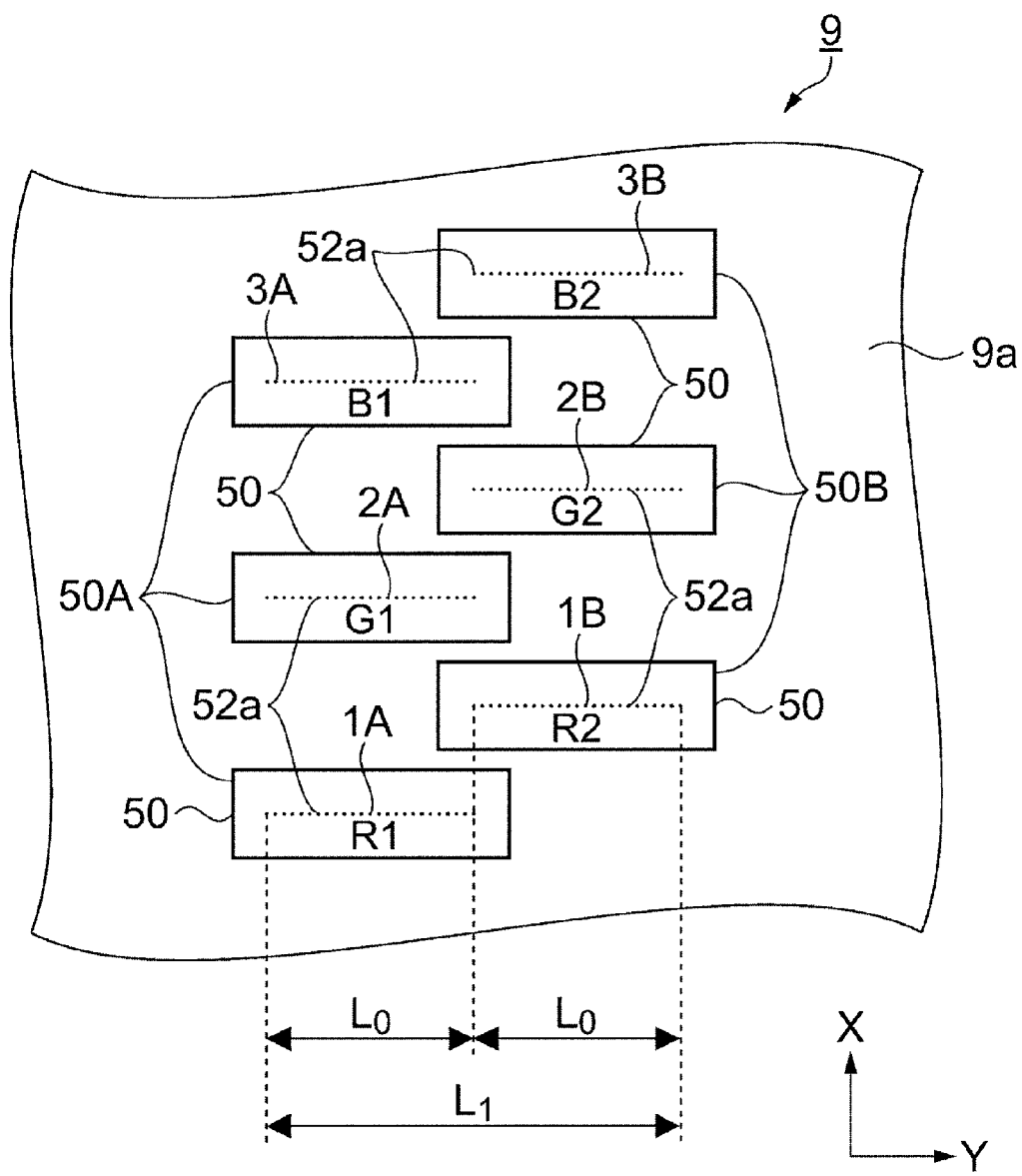
F I G. 4

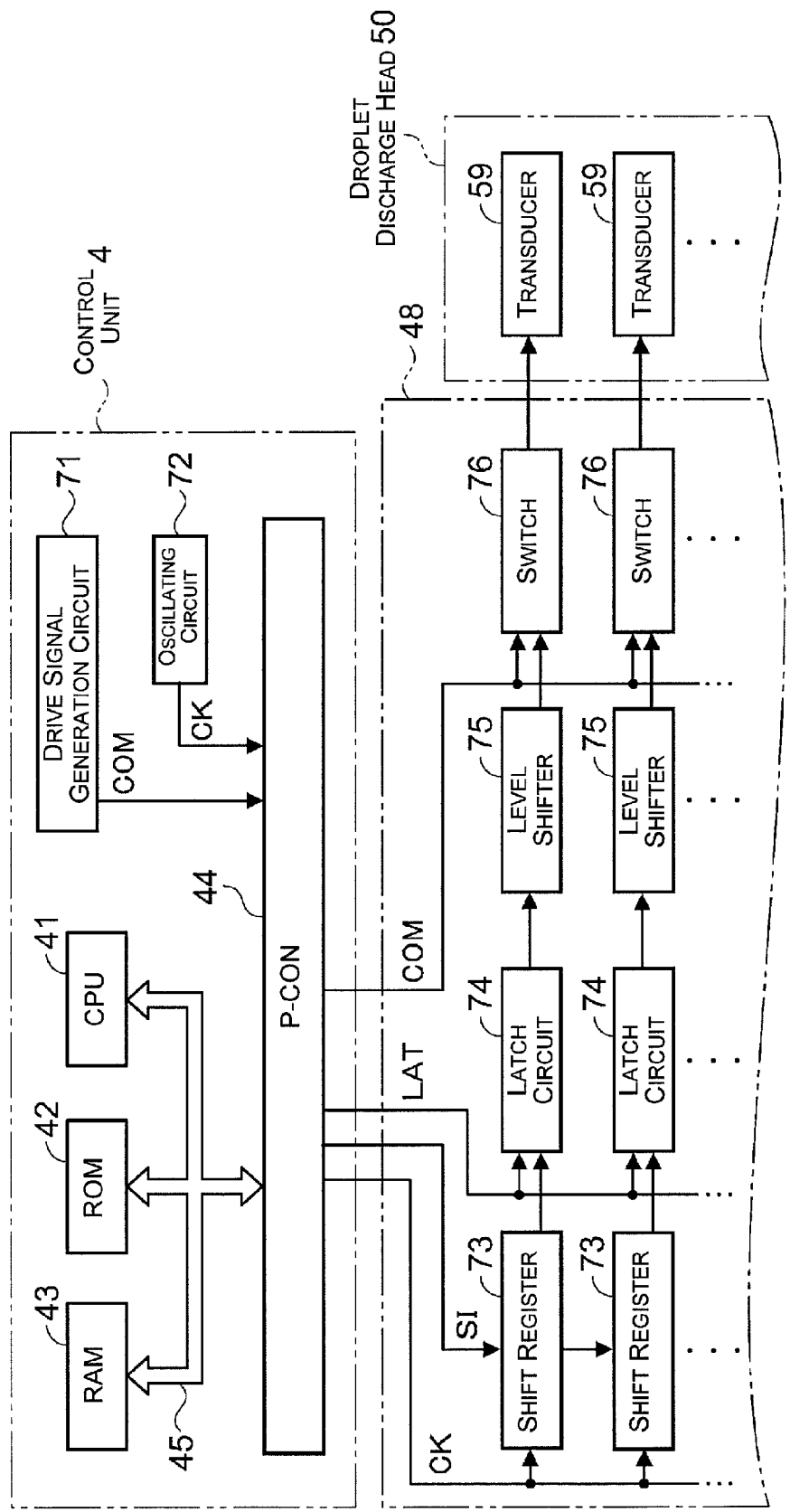
F I G. 6

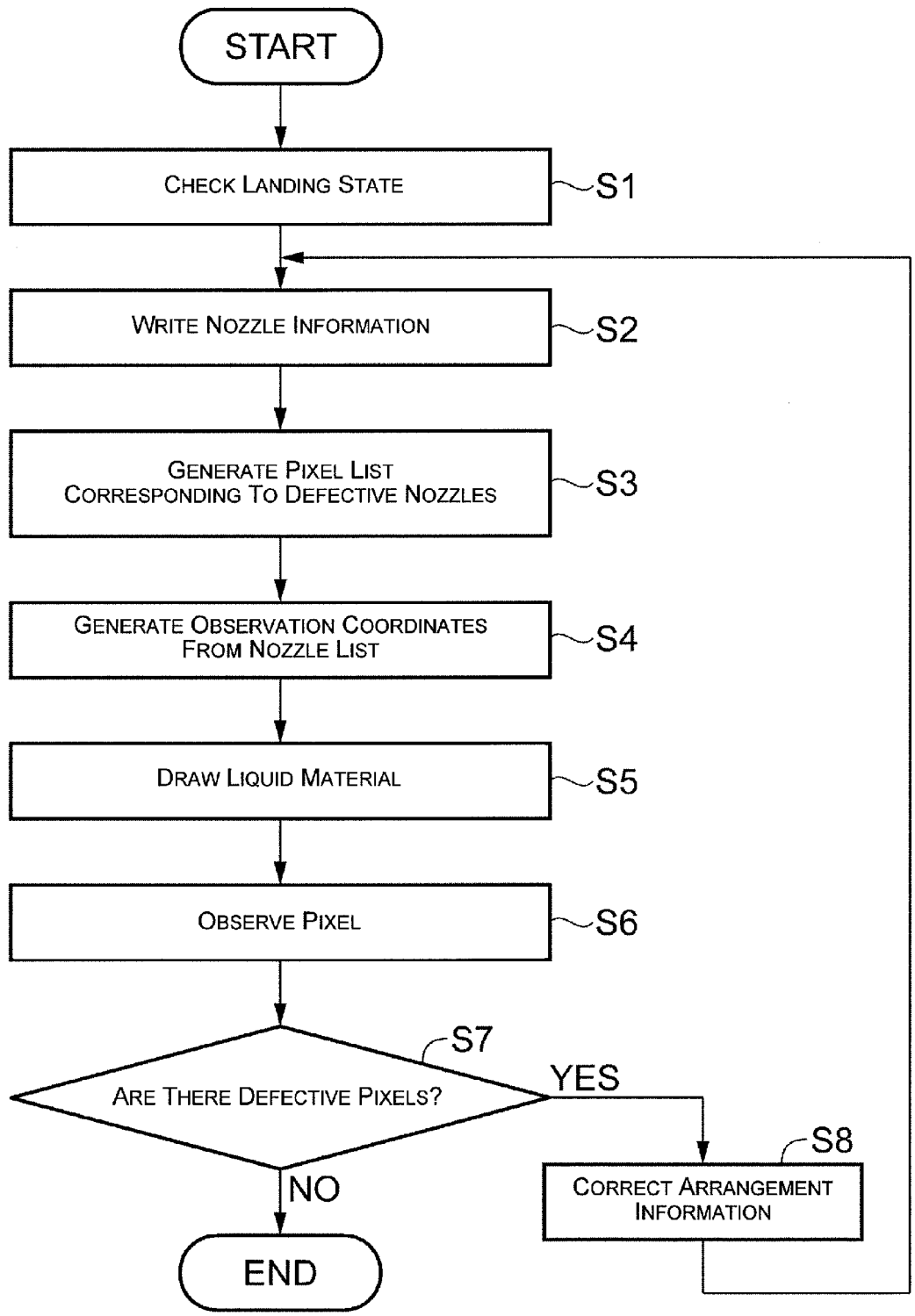
F I G. 10

F I G. 12A
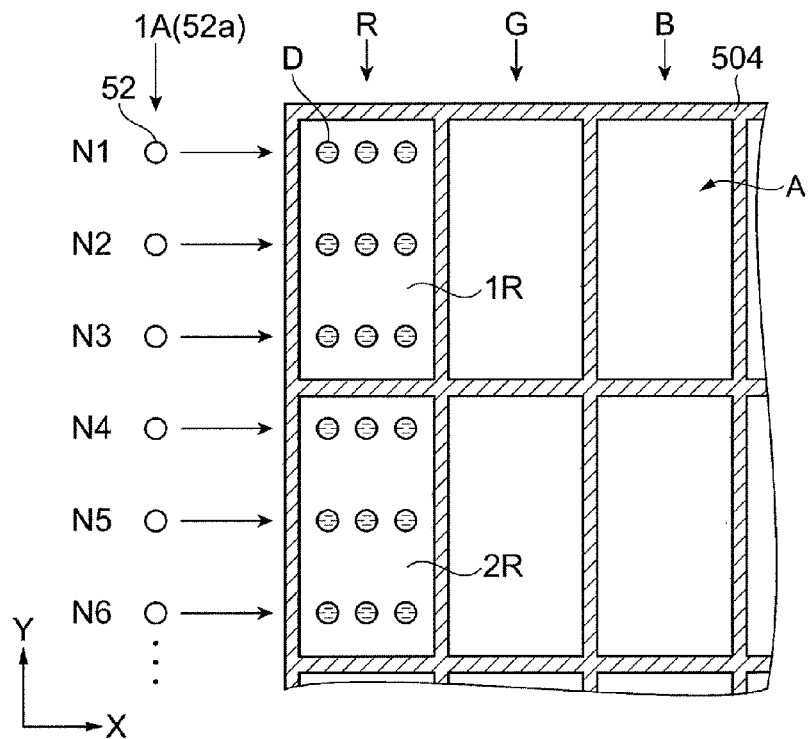
F I G. 12B
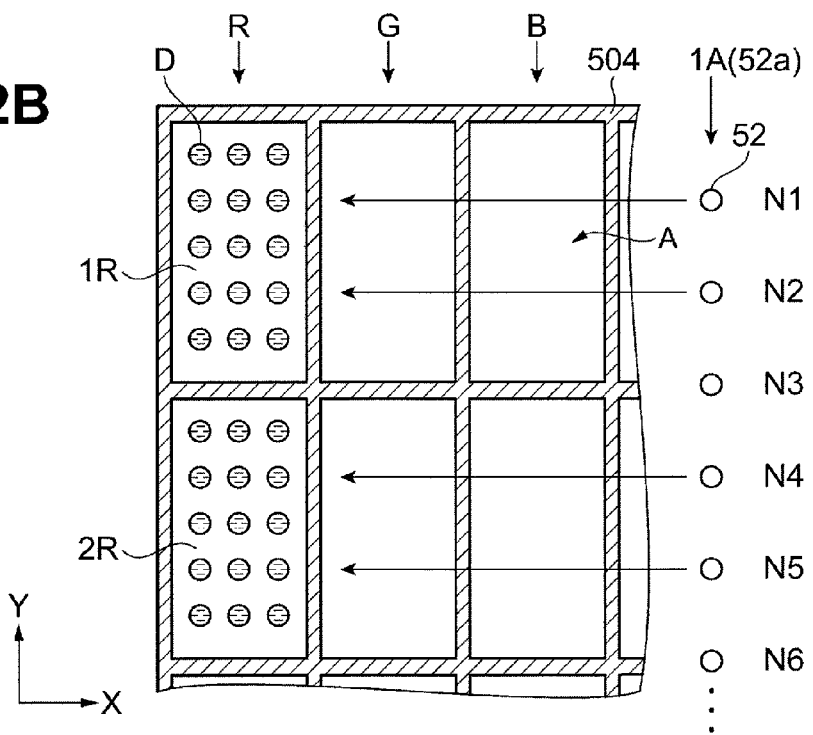

FIG. 13A

| Pixel No. | Nozzle No. | Scan 1 | | | | Scan 2 | | | |
|---|---|---|---|---|---|---|---|---|---|
| | | Nozzle Selection | Number Of Discharges | Drive Voltage | Discharge Timing | Nozzle Selection | Number Of Discharges | Drive Voltage | Discharge Timing |
| 1R | 1 | 1 | 3 | 1 | 1 | 1 | 3 | 1 | 1 |
| | 2 | 1 | 3 | 1 | 1 | 1 | 3 | 1 | 1 |
| | 3 | 1 | 3 | 1 | 1 | 0 | 3 | 1 | 1 |
| 2R | 4 | 1 | 3 | 1 | 1 | 1 | 3 | 1 | 1 |
| | 5 | 1 | 3 | 1 | 1 | 1 | 3 | 1 | 1 |
| | 6 | 1 | 3 | 1 | 1 | 0 | 3 | 1 | 1 |

FIG. 13B

| Nozzle No. | Clogging | Landing Position | | Landing Diameter | |
|---|---|---|---|---|---|
| | | X | Y | Too Large | Too Small |
| 1 | 0 | 0 | 0 | 0 | 0 |
| 2 | 1 | 0 | 0 | 0 | 0 |
| 3 | 0 | +40 | 0 | 0 | 0 |
| 4 | 0 | 0 | 0 | 0 | 1 |
| 5 | 0 | 0 | 0 | 1 | 0 |
| 6 | 0 | -20 | 0 | 0 | 0 |

PIXEL OBSERVATION SYSTEM, DRAWING SYSTEM, LIQUID MATERIAL DRAWING METHOD, COLOR FILTER MANUFACTURING METHOD, AND ORGANIC EL ELEMENT MANUFACTURING METHOD

CROSS-REFERENCE TO RELATED APPLICATIONS

This application claims priority to Japanese Patent Application No. 2006-334154 filed on Dec. 12, 2006. The entire disclosure of Japanese Patent Application No. 2006-334154 is hereby incorporated herein by reference.

BACKGROUND

1. Technical Field

The present invention relates to a pixel observation system for observing pixels that are formed by a liquid droplet discharge method, to a drawing system that uses a liquid droplet discharge method, to a liquid material drawing method, to a color filter manufacturing method, and to an organic EL element manufacturing method.

2. Related Art

Japanese Laid-Open Patent Application Publication No. 2006-130383 discloses one example of known pixel observation systems that relate to a droplet discharge method include a dot deviation detection method and a dot deviation detection device capable of simply and rapidly detecting a dot misalignment obtained from the landing of a droplet discharged from a nozzle of the droplet discharge head onto a detection object.

Japanese Laid-Open Patent Application Publication No. 2003-275650 discloses one example of known drawing systems that use a droplet discharge method include a drawing system for drawing one or more chip-shaped regions on a workpiece by causing functional droplets to be selectively discharged from a plurality of nozzles provided to a functional-droplet discharge head while causing the functional-droplet discharge head to move relative to the workpiece based on data that are stored in a recording medium.

In the abovementioned drawing system, the functional droplets are discharged and drawn on the workpiece based on discharge pattern data of each nozzle that are stored in the recording medium.

The abovementioned discharge pattern data are generated based on at least chip information relating to the position of a chip formation region on the workpiece, pixel information relating to the arrangement of pixels in a chip formation region, and nozzle information relating to the arrangement of the nozzles with respect to the workpiece.

In view of the above, it will be apparent to those skilled in the art from this disclosure that there exists a need for an improved pixel observation system, drawing system, liquid material drawing method, color filter manufacturing method, and organic EL element manufacturing method. This invention addresses this need in the art as well as other needs, which will become apparent to those skilled in the art from this disclosure.

SUMMARY

When a color filter or other pixel formation element is formed on a workpiece using a droplet discharge method, the droplets must be stably discharged from the nozzles. However, nozzle blockage, flight deviation in which there is a deviation in the landing position of the discharged droplets, and other defects may occur, and it is difficult to always perform stable discharge. In the pixel observation system disclosed in Japanese Laid-Open Patent Application Publication No. 2006-130383, the provision of a dot deviation detection device to the droplet discharge device helps to enhance the product yield. However, no method has been proposed for effective introduction to a drawing system such as that of Japanese Laid-Open Patent Application Publication No. 2003-275650 in actual practice.

The present invention was developed in view of the foregoing problems, and an object of the present invention is to provide a pixel observation system capable of early discovery of defective pixels that are caused by liquid material discharge defects, and to provide a drawing system, a liquid material drawing method, a color filter manufacturing method, and an organic EL element manufacturing method.

The pixel observation system according to a first aspect of the present invention is a pixel observation system for observing pixels formed by discharging a liquid material including a functional material from a plurality of nozzles to a plurality of pixel regions on a substrate in synchronization with relative movement of the substrate and the nozzles. The pixel observation system includes a memory unit, a coordinate generation unit and an observation unit. The memory unit is configured to store at least nozzle information indicative of discharge states of the liquid material in the nozzles and arrangement information indicative of an arrangement of each of the nozzles with respect to each of the pixel regions in the relative movement. The coordinate generation unit is configured to generate observation coordinates of observation regions on the substrate based on the nozzle information and the arrangement information, the coordinate generation unit being further configured to include coordinates of at least some of the pixel regions over which the nozzles scan through one cycle of the relative movement in the observation coordinates. The observation unit is configured and arranged to observe the pixel regions positioned at the observation coordinates generated by the coordinate generation unit.

According to this configuration, the coordinate generation unit generates coordinates of the pixel region with which the plurality of nozzles coincides in at least one cycle of the relative movement as the observation coordinates. Consequently, a defective pixel formed by a defective nozzle in which a discharge defect occurs can be discovered early by observing the pixel region that is positioned at the observation coordinates even when not all of the pixel regions are observed. Specifically, the pixels can be efficiently observed.

In a preferred configuration, the memory unit is further configured to store the nozzle information including information of a defective nozzle in which a discharge defect occurs, and the coordinate generation unit is further configured to include coordinates of the pixel region corresponding to the defective nozzle and the pixel regions disposed adjacent to the pixel region corresponding to the defective nozzle in the observation coordinates. The pixels can thereby be observed more efficiently.

In a preferred configuration, the memory unit is further configured to store the nozzle information including information of a defective nozzle indicative of at least one of a clogged nozzle, a landing-position-deviated nozzle, and an abnormal discharge quantity nozzle. This configuration enables early discovery of a defective pixel in which irregular discharge occurs due to at least one of a clogged nozzle, a landing-position-deviated nozzle, and an abnormal discharge quantity nozzle.

In a preferred configuration, the observation unit includes an imaging mechanism and an image processing unit that is configured to convert an image captured by the imaging mechanism to image information. A defective nozzle can thereby be reliably identified using the image information converted by the image processing unit.

The pixel observation system is preferably further provided with a nozzle information generation unit configured and arranged to discharge droplets from the nozzles on a landing observation discharge object and to generate the nozzle information from the image information obtained by the image processing unit based on the image of the droplets on the landing observation discharge object captured by the imaging mechanism.

According to this configuration, the nozzle information is generated by the nozzle information generation unit based on the image information that indicates the landing state of droplets that are landed on the landing observation discharge object. Since droplets are discharged onto the landing observation discharge object, nozzle information relating to non-discharge due to nozzle clogging, as well as landing position deviation or abnormal discharge quantity can be reliably monitored.

In a preferred configuration, the landing observation discharge object is a recording paper. According to this configuration, the use of recording paper reduces the effects of interfacial tension and the like of the surface on which the droplets are landed, and makes it possible to more reliably obtain information relating to non-discharge due to nozzle clogging, as well as landing position deviation or abnormal discharge quantity.

In a preferred configuration, the liquid material is discharged and drawn in synchronization with a plurality of cycles of relative movement of the substrate and the nozzles, and the memory unit is further configured to store the arrangement information for each cycle of the relative movement. When the liquid material is discharged in synchronization with a plurality of cycles of relative movement of the substrate and the plurality of nozzles, the nozzles that coincide with each pixel region on the substrate are not always the same in the relative movements. According to this configuration, since the arrangement information for each relative movement is stored in the memory unit, observation coordinates that correspond to the actual discharging and drawing of the liquid material can be accurately generated.

In a preferred configuration, the memory unit is further configured to store the arrangement information divided into a forward movement and a reverse movement of the relative movement. When discharge of the liquid material is divided into forward movement and reverse movement of the substrate and the plurality of nozzles, a defective nozzle that is determined to have a discharge defect during forward movement does not necessarily have a discharge defect during reverse movement. The severity of landing position deviation varies according to the relationship between the flight deflection direction and the direction of relative movement particularly in the case of flight deflection. According to this configuration, since the arrangement information of nozzles that coincide with each pixel region in relative movement is stored so as to be divided into forward movement and reverse movement, defective nozzles can be classified by forward movement and reverse movement, and can be more accurately identified.

A drawing system according to another aspect of the present invention includes the pixel observation system according to above aspects of the present invention, and a droplet discharge device configured and arranged to discharge and draw droplets of the liquid material including the functional material from the nozzles to the pixel regions on the substrate.

According to this configuration, since a pixel observation system is provided that is capable of early discovery of defective pixels caused by liquid material discharge defects, the information of the defective pixels from the pixel observation system can be reflected in the discharging and drawing of the liquid material. Specifically, a drawing system can be provided that has minimal liquid material discharge defects and stable discharge quality.

The drawing system is preferably further provided with a general control unit configured to control operations of the droplet discharge device and the pixel observation system so that a defective nozzle is identified based on defective pixel information obtained by the pixel observation system, discharging of the droplets from the defective nozzle is stopped, and the liquid material is discharged from one of the nozzles other than the defective nozzle to make up for a deficiency in the liquid material discharged onto each of the pixel regions.

According to this configuration, the general control unit identifies a defective nozzle based on the defective pixel information provided by the pixel observation system, and applies the necessary quantity of droplets of the liquid material for each pixel region without using the defective nozzle.

The drawing system is preferably further provided with a general control unit configured to control operations of the droplet discharge device and the pixel observation system so that one of a landing-position-deviated nozzle and an abnormal discharge quantity nozzle is identified as a defective nozzle based on defective pixel information obtained by the pixel observation system, and a drive condition for discharging the droplets from the defective nozzle is modified.

According to this configuration, since the drive conditions of the nozzle are modified according to whether the nozzle is a landing-position-deviated nozzle or an abnormal discharge quantity nozzle, the necessary quantity of the liquid material for each pixel region can be applied as droplets even when the nozzle identified as a defective nozzle is used.

A liquid material drawing method according to another aspect of the present invention is a liquid material drawing method for discharging a liquid material including a functional material from a plurality of nozzles to a plurality of pixel regions on a substrate in synchronization with relative movement of the substrate and the nozzles to form a plurality of pixels. The liquid material drawing method includes: generating observation coordinates corresponding to observation regions on the substrate based on nozzle information indicative of discharge states of the liquid material discharged from the nozzles and arrangement information indicative of an arrangement of each of the nozzles with respect to each of the pixel regions in the relative movement; discharging and drawing droplets of the liquid material in the pixel regions from the nozzles based on the arrangement information; observing the pixel regions positioned at the observation coordinates of the substrate after the liquid material is discharged and drawn on the substrate; identifying a defective nozzle corresponding to a defective pixel among the pixel regions; and correcting the arrangement information when the defective pixel is detected. The generating of the observation coordinates including generating coordinates of at least some of the pixel regions over which the nozzles scan through one cycle of the relative movement as the observation coordinates.

According to this method, coordinates of the pixel region with which the plurality of nozzles coincides in at least one cycle of the relative movement are generated as the observation coordinates in the observation coordinate generation step. Consequently, a defective pixel formed by a defective nozzle in which a discharge defect occurs can be discovered early in comparison to a case in which all of the pixel regions are observed. In the correction step, a defective nozzle is identified, and the arrangement information of the nozzle that coincides with each pixel region is corrected. Consequently, the liquid material can be discharged and drawn in the drawing step based on the corrected arrangement information. A liquid material drawing method can therefore be provided that is capable of reducing discharge defects through early discovery of defective pixels, and of applying the necessary quantity of the liquid material for each pixel region.

The liquid material drawing method preferably further includes updating the nozzle information based on information of the defective nozzle identified. According to this method, since the nozzle information is updated in conjunction with identification of a defective nozzle, the observation coordinates are generated based on the newest nozzle information, and missed discovery of defective pixels can be reduced.

In a preferred configuration, the generating of the observation coordinates includes generating coordinates of the pixel region corresponding to the defective nozzle and the pixel regions disposed adjacent to the pixel region corresponding to the defective nozzle as the observation coordinates. Since there is a high probability of defective pixels being formed due to defective nozzles, defective pixels can be discovered more efficiently.

In a preferred configuration, the identifying of the defective nozzle includes identifying at least one of a clogged nozzle, a landing-position-deviated nozzle, and an abnormal discharge quantity nozzle as the defective nozzle. This method enables early discovery of a defective pixel in which irregular discharge occurs due to at least one of a clogged nozzle, a landing-position-deviated nozzle, and an abnormal discharge quantity nozzle.

The liquid material drawing method preferably further includes: discharging droplets of the liquid material onto a test discharge object from the nozzles; and measuring a landing diameter and a landing position deviation of the droplets discharged onto the test discharge object. Moreover, the generating of the observation coordinates includes generating the observation coordinates based on the nozzle information including dimensional information of the nozzles indicative of the landing diameter and the landing position deviation. According to this method, since the nozzle information includes dimensional information of the landing diameter and the landing position deviation obtained in the landing state checking step, the arrangement information of nozzles that coincide with each pixel region can be precisely corrected.

In a preferred configuration, the discharging of the droplets includes discharging the droplets while the nozzles and the test discharge object are moved relative to each other so that the droplets are landed on an imaginary straight line in each of a forward movement and a reverse movement of a relative movement of the nozzles and the test discharge object. This method makes it possible to assess fluctuation of the landing state in forward movement and reverse movement of the relative movement. Specifically, the arrangement information of the nozzles can be more precisely corrected.

In a preferred configuration, the test discharge object is a recording paper. According to this method, the effects of interfacial tension and the like of the surface on which the droplets are landed are reduced in comparison to a case in which the droplets are landed on a substrate, and information relating to non-discharge due to nozzle clogging, as well as landing position deviation or abnormal discharge quantity can be more reliably obtained.

In a preferred configuration, the arrangement information includes selection information of a nozzle for discharging the droplets, and the correcting of the arrangement information includes correcting the arrangement information so that the defective nozzle is not selected, and one of the nozzles other than the defective nozzle is selected to discharge the liquid material to make up for a deficiency in the liquid material discharged onto each of the pixel regions. According to this method, the necessary quantity of the liquid material for each pixel region can be applied as droplets without using the defective nozzle.

In a preferred configuration, the arrangement information includes a drive condition for discharging the droplets for each of the nozzles, and the correcting of the arrangement information includes identifying one of a landing-position-deviated nozzle and an abnormal discharge quantity nozzle as the defective nozzle, and varying the drive condition for discharging the droplets from the defective nozzle. According to this method, since the drive conditions of the nozzle are modified according to whether the nozzle is a landing-position-deviated nozzle or an abnormal discharge quantity nozzle, the necessary quantity of the liquid material for each pixel region can be applied as droplets even when the nozzle identified as a defective nozzle is used.

A method according to another aspect of the present invention is a method for manufacturing a color filter having at least three colors of color layers in the pixel regions partitioned on the substrate. The color filter manufacturing method includes; performing the liquid material drawing method according to the above aspects of the present invention to discharge and draw at least three colors of the liquid material in the pixel regions with the liquid material including a color layer formation material; and curing the liquid material discharged and drawn on the substrate to form the at least three colors of the color layers.

According to this method, since the abovementioned liquid material drawing method of the present invention is used that is capable of reducing discharge defects and applying the necessary quantity of the liquid material for each pixel region as droplets, a color filter provided with at least three colors of color layers that has the desired optical characteristics after curing can be manufactured at high yield.

A method according to another aspect of the present invention is a method for manufacturing an organic EL element having at least a luminescent layer in the pixel regions partitioned on the substrate. The organic EL manufacturing method includes: performing the liquid material drawing method according to the above aspects of the present invention to discharge and draw the liquid material including a luminescent layer formation material in the pixel regions; and curing the liquid material discharged and drawn on the substrate to form the luminescent layer.

According to this method, since the liquid material drawing method of the present invention capable of reducing discharge defects is used that is capable of reducing discharge defects and applying the necessary quantity of the liquid material for each pixel region as droplets, an organic EL element having minimal irregularities in luminosity, luminance, and other characteristics due to discharge defects after curing can be manufactured at high yield.

These and other objects, features, aspects and advantages of the present invention will become apparent to those skilled in the art from the following detailed description, which, taken in conjunction with the annexed drawings, discloses preferred embodiments of the present invention.

BRIEF DESCRIPTION OF THE DRAWINGS

Referring now to the attached drawings which form a part of this original disclosure:

FIG. 1 is a schematic diagram showing the structure of the drawing system;

FIG. 4 is a schematic plan view showing the arrangement of the droplet discharge heads in the head unit;

FIG. 6 is a block diagram showing the details of discharge control;

FIG. 10 is a flowchart showing the liquid material drawing method;

FIGS. 12A and 12B are schematic plan views showing an example of the arrangement of droplets in the pixel regions;

FIG. 13A is an example of a table showing the nozzle arrangement information;

FIG. 13B is an example of a table showing the nozzle information;

DETAILED DESCRIPTION OF EXEMPLARY EMBODIMENTS

First Embodiment

Figure 2:
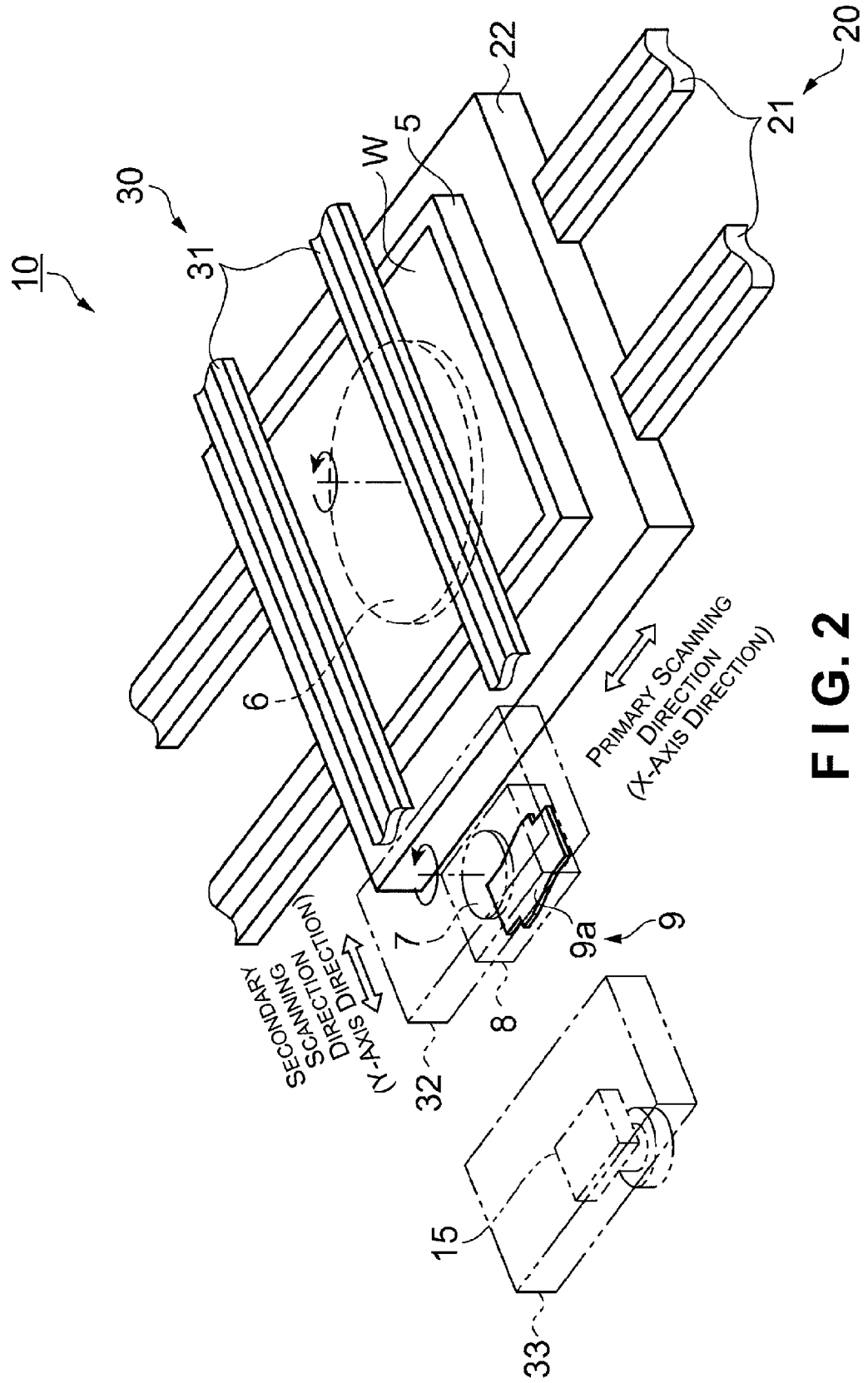
FIG. 2 is a schematic perspective view showing the structure of the droplet discharge device.

A first embodiment of the present invention will be described using as an example a method for manufacturing a color filter having colored layers in a plurality of colors in color regions as a plurality of pixel regions on a substrate. The color layers constitutes pixels that are formed by discharging and drawing droplets of a liquid material that includes a color layer forming material as a functional material to a plurality of pixel regions. A drawing system such as the one described below is used to discharge and draw the droplets of the liquid material.

Pixel Observation System and Drawing System

FIG. 1 is a schematic view showing the structure of the drawing system. As shown in FIG. 1, the drawing system 1 of the present embodiment is provided with a droplet discharge device 10 for discharging droplets of the liquid material, a pixel observation system 2 having an observation unit 3 for observing pixel regions in which the liquid material is discharged and drawn, and an upper-level computer 11 as a general control unit for performing overall control of the droplet discharge device 10 and the pixel observation system 2.

The observation unit 3 is provided with a camera 15 as an imaging mechanism for observing and capturing an image of a pixel region; and an image processing unit 49 for converting the image captured by the camera 15 into image information. The camera 15 is provided with a CCD or other imaging element, for example, and is capable of distinguishing the color of an imaged pixel. The camera 15 and the image processing unit 49 are mounted in the droplet discharge device 10. The image processing unit 49 may also be provided to the upper-level computer 11.

A display unit 13 capable of displaying control information, a memory unit 14 for storing the control information, and a keyboard or other input unit 12 for inputting control data, a control program for controlling the droplet discharge device 10, or other control information are connected to the upper-level computer 11. The memory unit 14 may be a hard disk or other storage device or memory that is housed within the upper-level computer 11, or the memory unit 14 may be an external server.

The upper-level computer 11 is capable not only of transmitting the control program, control data, or other control information to the droplet discharge device 10, but also of modifying the control information. Nozzle information indicating the discharge state of the liquid material, arrangement information of nozzles 52 that coincide with each pixel region during discharging and drawing of the liquid material in pixel regions of the substrate are stored in the memory unit 14. The upper-level computer 11 has the function of an observation coordinate generation unit generating observation coordinates on the substrate based on the nozzle information and the arrangement information. The upper-level computer 11 also has the function of a nozzle information generation unit for modifying old nozzle information and generating new nozzle information.

In this case, the pixel observation system 2 includes the upper-level computer 11, the input unit 12, the display unit 13, and the memory unit 14.

The droplet discharge device 10 will next be described based on FIGS. 2 through 7. FIG. 2 is a schematic perspective view showing the structure of the droplet discharge device.

As shown in FIG. 2, the droplet discharge device 10 is provided with a workpiece movement mechanism 20 for moving a motherboard W as a workpiece in a primary scanning direction (X-axis direction), and a head movement mechanism 30 for moving a droplet discharge head 50 (see FIG. 3) in a secondary scanning direction (Y-axis direction).

The workpiece movement mechanism 20 is provided with a pair of guide rails 21, a movement stage 22 that moves along the pair of guide rails 21, and a setting table 5 for mounting the motherboard W that is attached via a θ table 6 as a rotation mechanism on the movement stage 22. The movement stage 22 is moved in the primary scanning direction through the use of an air slider and a linear motor (not shown) provided inside the guide rails 21. The setting table 5 is configured so as to be capable of attaching and fixing the motherboard W, and a reference axis in the motherboard W can be properly aligned with the primary scanning direction and the secondary scanning direction through the use of the θ table 6.

The head movement mechanism 30 is provided with a pair of guide rails 31, and two movement stages 32, 33 that move along the pair of guide rails 31. The movement stage 32 is provided with a carriage 8 that is attached by suspension via a rotation mechanism 7. The carriage 8 is provided with a head unit 9 in which a plurality of droplet discharge heads 50 is mounted. A liquid material feeding mechanism (not shown) for supplying the liquid material to the droplet discharge heads 50, and a head driver 48 (see FIG. 5) for electrically controlling the driving of the plurality of droplet discharge heads 50 are also provided. The movement stage 32 moves the carriage 8 in the Y-axis direction so that the head unit 9 is positioned facing the motherboard W.

The camera 15 is mounted on the movement stage 33. The camera 15 is capable of moving in the Y-axis direction through the use of the movement stage 33 so as to observe and image the landing state of the landed droplets discharged from the droplet discharge heads 50 onto the surface of the motherboard W. An illumination device for illuminating the imaged body may be provided to the movement stage 33 as needed.

Besides the structures described above, a maintenance mechanism for eliminating nozzle clogging in the plurality of droplet discharge heads 50 mounted in the head unit 9, removing debris or contamination from the nozzle surfaces, and performing other maintenance is provided to the droplet discharge device 10 in a position facing the plurality of droplet discharge heads 50, but is not shown in the drawings.

Figure 3A:
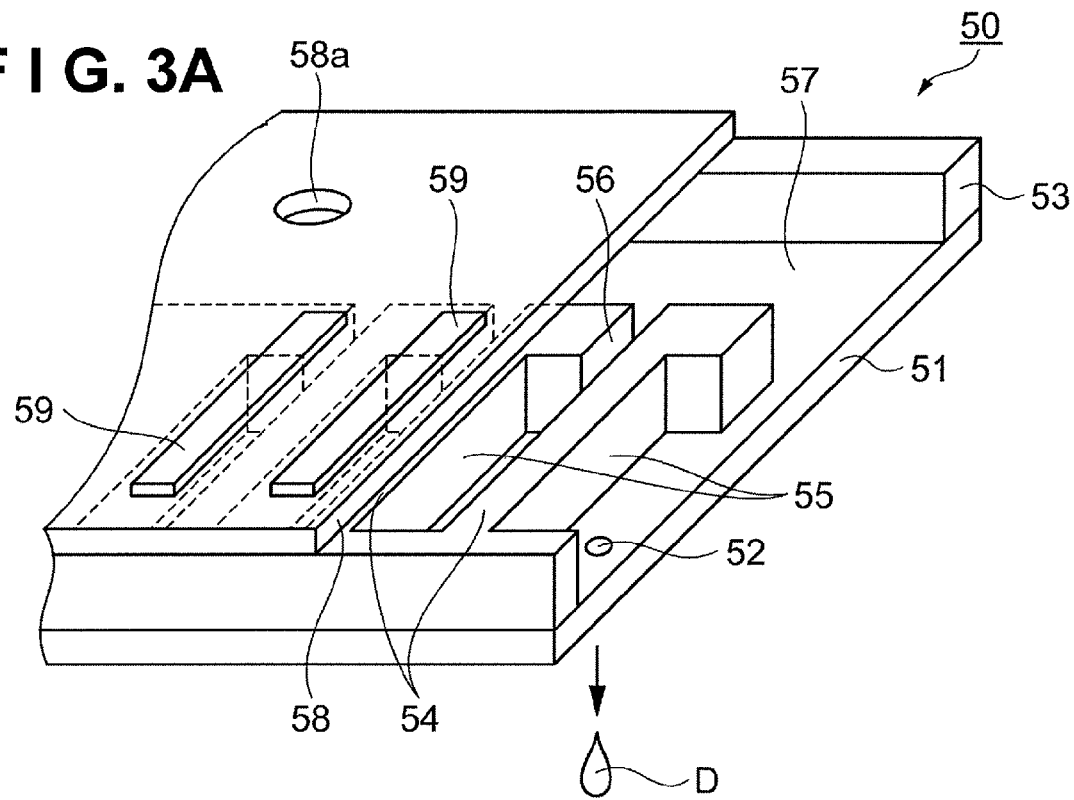
FIGS. 3A and 3B are schematic diagrams showing the structure of a droplet discharge head.
Figure 3B:
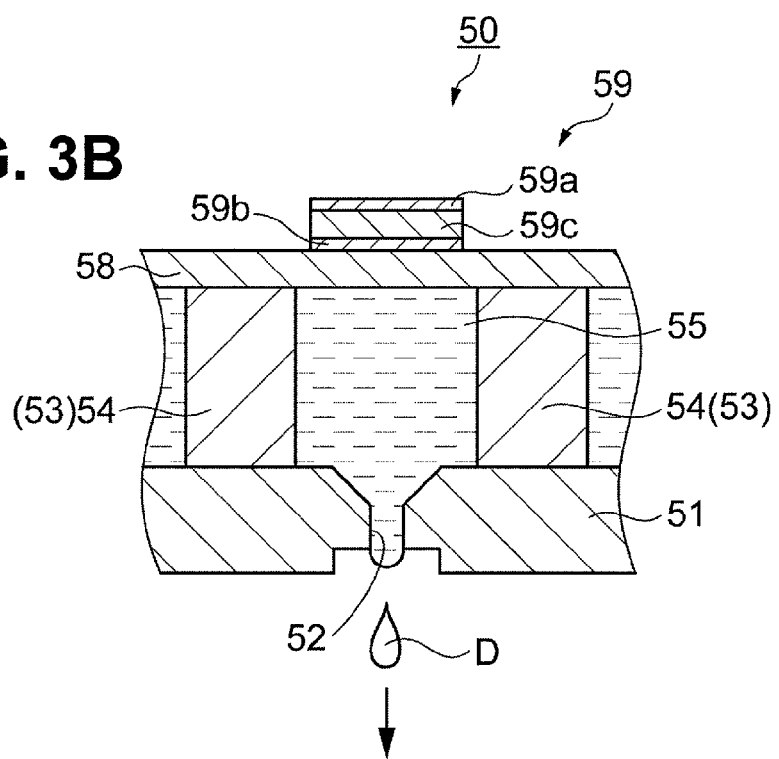

FIG. 3 is a schematic view showing the structure of the droplet discharge heads. FIG. 3A is a schematic exploded perspective view, and FIG. 3B is a sectional view showing the structure of the nozzle part. As shown in FIGS. 3A and 3B, the droplet discharge heads 50 have a structure in which a nozzle plate 51 having a plurality of nozzles 52 from which droplets are discharged; a cavity plate 53 having barriers 54 for partitioning cavities 55 with which the plurality of nozzles 52 communicates; and an oscillation plate 58 having transducers 59 as energy generation means that correspond to the cavities 55 are layered in sequence and joined together.

The cavity plate 53 has the barriers 54 for partitioning the cavities 55 with which the nozzles 52 communicate, and has channels 56, 57 for filling the liquid material into the cavities 55. The channel 57 is between the nozzle plate 51 and the oscillation plate 58, and the space thus formed serves as a reservoir in which the liquid material is stored.

The liquid material is fed through a conduit from the liquid material feeding mechanism and through a feeding hole 58a provided to the oscillation plate 58, and is stored in the reservoir. The liquid material is then filled into the cavities 55 through the channels 56.

As shown in FIG. 3B, the transducers 59 are piezoelectric elements composed of a piezo element 59c and a pair of electrodes 59a, 59b that sandwich the piezo element 59c. A drive voltage pulse is applied to the pair of electrodes 59a, 59b from the outside, whereby the bonded oscillation plate 58 is caused to change shape. The volume of the cavities 55 divided by the barriers 54 thereby increases, and the liquid material is drawn into the cavities 55 from the reservoir. When application of the drive voltage pulse is ended, the oscillation plate 58 returns to the original state and presses on the filled liquid material. This structure thereby enables the liquid material to be discharged as droplets from the nozzles 52. The discharging of the liquid material can be controlled for each of the nozzles 52 by controlling the drive voltage pulse that is applied to the piezo element 59c.

The droplet discharge heads 50 are not limited to being provided with piezoelectric elements (piezo elements). The droplet discharge heads 50 may be provided with an electromechanical conversion element for displacing the oscillation plate 58 through electrostatic adsorption, or an electrothermal conversion element for heating the liquid material and discharging the liquid material from the nozzles 52 as droplets.

FIG. 4 is a schematic plan view showing the arrangement of the droplet discharge heads in the head unit. FIG. 4 is specifically a view from the side facing the setting table 5.

As shown in FIG. 4, the head unit 9 is provided with a head plate 9a in which the plurality of droplet discharge heads 50 is arranged. A total of six droplet discharge heads 50 that include a head group 50A composed of three droplet discharge heads 50, and a head group 50B composed of three droplet discharge heads 50 are mounted in the head plate 9a. In this case, the head R1 (droplet discharge head 50) of the head group 50A, and the head R2 (droplet discharge head 50) of the head group 50B discharge the same type of liquid material. The same configuration applies for the other heads G1 and G2, and B1 and B2. Specifically, a configuration is adopted in which three different types of liquid material can be discharged.

Each droplet discharge head 50 has a nozzle row 52a composed of a plurality (180) of nozzles 52 that is arranged at substantially equal intervals (a nozzle pitch of approximately 140 μm). The diameter of the nozzles 52 is approximately 20 μm. The draw width that can be drawn by a single droplet discharge head 50 is designated as $L_0$, which is the effective length of the nozzle row 52a. A nozzle row 52a is assumed hereinafter to be composed of 180 nozzles 52.

In this case, head R1 and head R2 are arranged in the primary scanning direction so that nozzle rows 52a (nozzle row 1A and nozzle row 1B) that are adjacent to each other as viewed from the primary scanning direction (X-axis direction) are continuous at a pitch of one nozzle in the secondary scanning direction (Y-axis direction) that is orthogonal to the primary scanning direction. Accordingly, the effective draw width $L_1$ of head R1 and head R2 that discharge the same type of liquid material is twice the draw width $L_0$. The same arrangement in the primary scanning direction is adopted in heads G1 and G2, and heads B1 and B2.

The nozzle rows 52a provided to the droplet discharge heads 50 are not limited to single rows. For example, when a plurality of nozzle rows 52a is offset with respect to each other, the effective nozzle pitch decreases, and the droplets can be discharged with high resolution.

Figure 5:
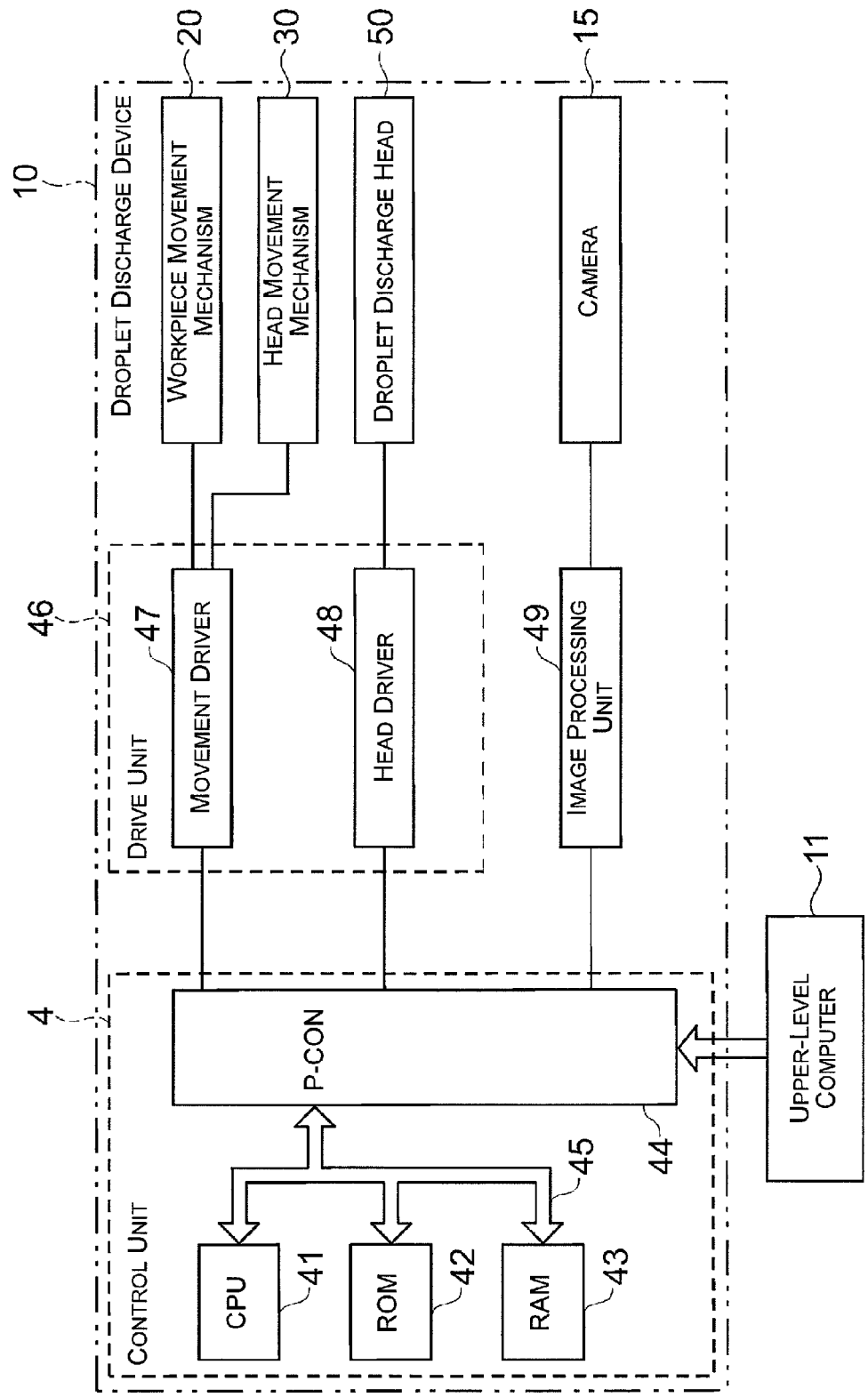
FIG. 5 is a block diagram showing the control system of the droplet discharge device.

The control system of the droplet discharge device 10 will next be described. FIG. 5 is a block diagram showing the control system of the droplet discharge device. The control system of the droplet discharge device 10 is provided with a drive unit 46 having various types of drivers for driving the droplet discharge heads 50, the workpiece movement mechanism 20, the head movement mechanism 30, and other components; and a control unit 4 for controlling the droplet discharge device 10 as well as the drive unit 46. The control system is also provided with an image processing unit 49 to which the camera 15 is connected.

The drive unit 46 is provided with a movement driver 47 for performing drive control of the linear monitors of the workpiece movement mechanism 20 and the head movement mechanism 30, respectively; a head driver 48 for performing discharge control of the droplet discharge heads 50; and a maintenance driver (not shown) for performing drive control of the maintenance units of the maintenance mechanism.

The control unit 4 is provided with a CPU 41, ROM 42, RAM 43, and a P-CON 44 that are connected to each other via a bus 45. The upper-level computer 11 is connected to the P-CON 44. The ROM 42 has a control program region for storing a control program or the like proceed by the CPU 41, and a control data region for storing control data and the like for performing drawing operations, function-restoring processing, and the like.

The RAM 43 has a draw data storage part for storing draw data for drawing on the motherboard W, a position data storage part for storing position data of the motherboard W and the droplet discharge heads 50 (actually, the nozzle rows 52a), and various other storage parts, and is used as a region for various types of operations for control processing. The image processing unit 49 and the various drivers and the like of the drive unit 46 are connected to the P-CON 44, and a logical circuit for assisting in the functions of the CPU 41 and handling interface signals with peripheral circuits is formed and incorporated in the P-CON 44. The P-CON 44 therefore inputs various types of commands and the like from the upper-level computer 11 to the bus 45 with or without modification, and outputs the data or control signal outputted from the CPU 41 and other components to the bus 45 to the drive unit 46 with or without modification in conjunction with the CPU 41.

The CPU 41 controls the droplet discharge device 10 as a whole by inputting various types of detection signals, various types of commands, various types of data, and the like via the P-CON 44, and processing the various types of data and the like in the RAM 43, and then outputting various types of control signals to the drive unit 46 and other components via the P-CON 44 in accordance with a control program in the ROM 42. For example, the CPU 41 controls the droplet discharge heads 50, the workpiece movement mechanism 20, and the head movement mechanism 30, positions the droplet discharge heads 50 and the motherboard W so as to face each other, and performs discharge and drawing of the droplets of the liquid material on the motherboard W from the plurality of nozzles 52 of the droplet discharge heads 50 in synchronization with the relative movement of the droplet discharge heads 50 and the motherboard W. In this case, discharging of the liquid material in synchronization with movement of the motherboard W in the X-axis direction is referred to as primary scanning, and movement of the head unit 9 in which the plurality of droplet discharge heads 50 is mounted in the Y-axis direction is referred to as secondary scanning. The droplet discharge device 10 of the present embodiment can discharge and draw the liquid material through multiple repetitions of a combination of primary scanning and secondary scanning. Primary scanning is not limited to movement of the motherboard W in one direction with respect to the droplet discharge heads 50, and the motherboard W may also be moved back and forth.

The CPU 41 drives the head movement mechanism 30 so that the movement stage 33 is moved in the Y-axis direction, and the mounted camera 15 is positioned facing the motherboard W. The state of the droplets landed on the surface of the motherboard W is observed and imaged. Position information whereby the camera 15 is moved with respect to the motherboard W for observation is generated by the upper-level computer 11 and inputted in advance as observation coordinates to the RAM 43. The image processing unit 49 is connected to the upper-level computer 11 via the P-CON 44. The upper-level computer 11 can display the image information captured by the camera 15 and converted by the image processing unit 49 in the display unit 13, and an operator can confirm the landing state of the droplets.

The image processing unit 49 converts the imaged landing state of the droplets to bitmap data. The CPU 41 can compute the landing diameter and the amount of landing position deviation of the droplets from the bitmap data. The computed results are written to the RAM 43, and are substantially simultaneously transmitted as nozzle information to the upper-level computer 11 and stored in the memory unit 14. Image confirmation and storage in the form of nozzle information in the memory unit 14 are performed in the same manner when clogging occurs in a nozzle 52, and the droplets are not discharged. Details of this process will be described in the liquid material drawing method hereinafter.

The method for controlling discharge in the droplet discharge heads will next be described with reference to FIGS. 6 and 7. FIG. 6 is a block diagram showing the details of discharge control. As shown in FIG. 6, the control unit 4 is provided with the CPU 41, the ROM 42, the RAM 43, the P-CON 44, and the bus 45, as well as with a drive signal generation circuit 71 for generating a drive signal (COM), and an oscillating circuit 72 for generating a clock signal (CK). The head driver 48 is provided with shift registers 73, latch circuits 74, level shifters 75, and switches 76, and is configured so as to be capable of selectively applying the drive signal (COM) to the transducers 59 that correspond to the nozzles 52 of the droplet discharge heads 50.

The upper-level computer 11 transmits control data in which the positions of the droplets in the drawing object are indicated as position information of the nozzles 52 to the control unit 4. The arrangement information includes the relative discharge positions of the plurality of nozzles 52 with respect to the motherboard W, the selection of nozzles 52 for discharge of droplets, the number of discharges of droplets, and the drive conditions when the droplets are discharged. The control unit 4 generates a nozzle data signal (SI) or a drive signal (COM) for each nozzle row unit in the following manner based on the items of control data.

Specifically, the CPU 41 decodes the control data and generates nozzle data that include ON/OFF information for each nozzle. The drive signal generation circuit 71 performs setting and generation of the drive signal (COM) based on the nozzle data computed by the CPU 41.

The nozzle data signal (SI) in which the nozzle data are converted to a serial signal is synchronized with the clock signal (CK) and transmitted to the shift registers 73, and the ON/OFF information of each of the nozzles 52 is stored. A latch signal (LAT) generated by the CPU 41 is inputted to the latch circuits 74, whereby the nozzle data are latched. The latched nozzle data are amplified by the level shifters 75, and a prescribed voltage is fed to the switches 76 when the nozzle data indicate "ON." When the nozzle data indicate "OFF," a voltage is not fed to the switches 76.

While the voltage increased by the level shifters 75 is being fed to the switches 76, the drive signal (COM) is applied to the transducers 59, and droplets are discharged from the nozzles 52 (see FIG. 3).

Figure 7:
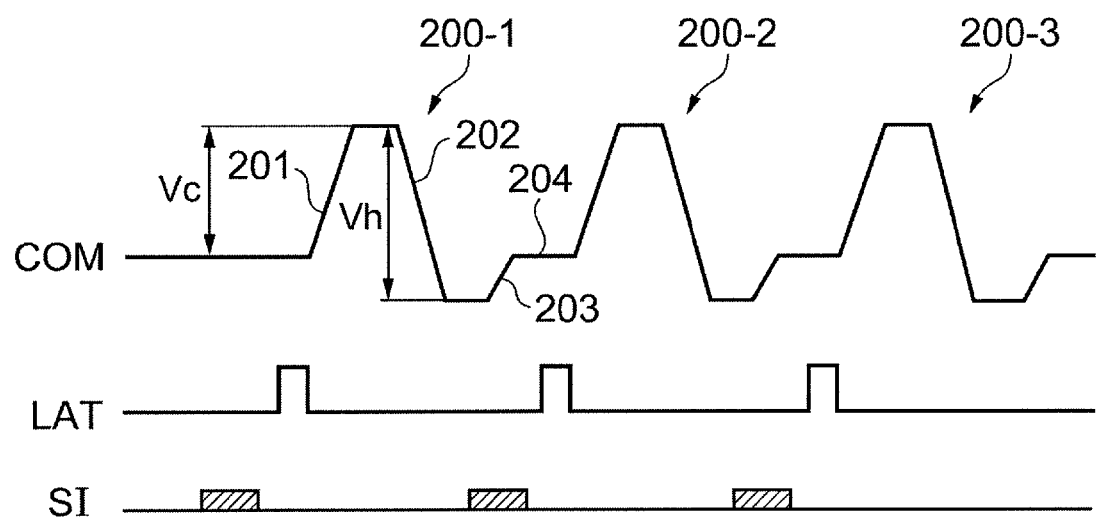
FIG. 7 is a diagram showing the control signals for discharge control.

Such discharge control is performed periodically as shown in FIG. 7 in synchronization with the relative movement (primary scanning) of the head unit 9 and the motherboard W.

FIG. 7 is a diagram showing the control signals for discharge control. In the drive signal (COM) as shown in FIG. 7, a sequence of pulse groups 200-1, 200-2, . . . that have an electrical discharge pulse 201, a charging pulse 202, and an electrical discharge pulse 203 is connected at an intermediate potential 204. A single droplet is discharged by a single pulse group in the manner described below.

Specifically, the potential level is increased, and the liquid material is drawn into the cavities 55 (see FIG. 3B) by the electrical discharge pulse 201. The liquid material inside the cavities 55 is then rapidly pressurized and expelled in the form of droplets (discharge) from the nozzles 52 by the sharp charging pulse 202. Lastly, the reduced potential level is returned to the intermediate potential 204 by the electrical discharge pulse 203, and the pressure oscillation (natural oscillation) generated inside the cavities 55 by the charging pulse 202 is cancelled.

The voltage components Vc, Vh, the time component (pulse slope, connection gap between pulses, and the like), and the like in the drive signal (COM) are parameters that have a significant bearing on the discharged amount, the discharge stability, and other factors, and these parameters require appropriate advance design. In this case, the period of the latch signal (LAT) is set to 20 kHz with consideration for the specific frequency characteristics of the droplet discharge heads 50. The speed (in this case, the movement speed of the setting table 5 in the X-axis direction) of relative movement of the droplet discharge heads 50 and the substrate W during primary scanning is set to 200 mm/second. Accordingly, when the discharge resolution is calculated by dividing the relative movement speed by the latch period, the unit of discharge resolution is 10 μm. Specifically, the discharge timing can be set for each nozzle 52 in units of discharge resolution. In other words, the droplets D can be arranged at a discharge interval in units of 10 μm on the surface of the motherboard W. When the timing at which the latch pulse is generated is based on a pulse that is outputted by an encoder (not shown) provided to the movement stage 22, the discharge timing can also be controlled in units of movement resolution.

The droplet discharge device 10 makes it possible for the liquid material to be discharged as droplets with varying discharge amounts and discharge timings by each nozzle 52 of the droplet discharge heads 50. Accordingly, when there is a nozzle 52 in which flight deflection occurs, for example, that is not restored by maintenance of the droplet discharge heads 50 by the maintenance mechanism, deviation of the landing position due to flight deflection can be corrected by changing the method of discharge control for the affected nozzle 52.

Since overall control of the pixel observation system 2 and the droplet discharge device 10 can be performed by the upper-level computer 11, when a clogged nozzle, a landing-position-deviated nozzle, or an abnormal discharge quantity nozzle is included as a defective nozzle in the nozzle information, other normal nozzles can be selected to discharge the liquid material instead of selecting the defective nozzle in which the discharge defect occurs.

Consequently, such a drawing system 1 is capable of placing the head unit 9 opposite the motherboard W through the use of the head movement mechanism 30, and discharging the necessary amount of the liquid material in the form of droplets with high positional accuracy from the total of six droplet discharge heads 50 that are provided to the head unit 9, in synchronization with primary scanning by the workpiece movement mechanism 20.

Figure 8:
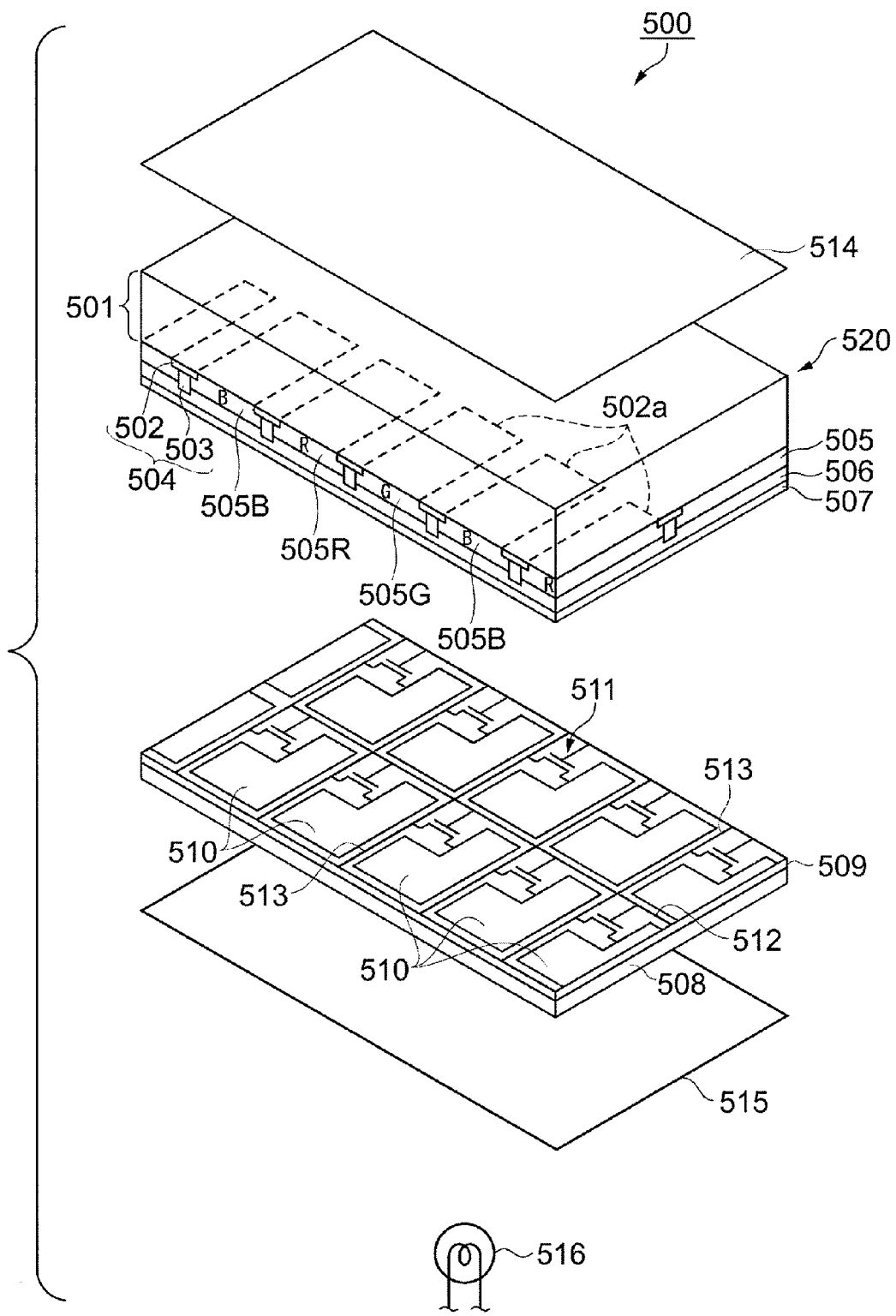
FIG. 8 is a schematic exploded perspective view showing the structure of the liquid crystal display device.

The color filter manufacturing method that uses the drawing system 1 of the present embodiment will next be described. The liquid crystal display device as an electro-optical device having a color filter will first be briefly described. FIG. 8 is a schematic exploded perspective view showing the structure of the liquid crystal display device.

As shown in FIG. 8, the liquid crystal display device 500 is provided with a TFT (Thin Film Transistor) transmissive liquid crystal display panel 520 and an illumination device 516 for illuminating the liquid crystal display panel 520. The liquid crystal display panel 520 is provided with an opposing substrate 501 having color filters 505 that have a color layer; an element substrate 508 having TFT elements 511 in which one of three terminals is connected to a pixel electrode 510; and liquid crystals (not shown) that are held between the opposing substrate 501 and the element substrate 508. An upper polarizer 514 and a lower polarizer 515 for polarizing the transmitted light are provided to the surfaces of the opposing substrate 501 and the element substrate 508 that form the outside of the liquid crystal display panel 520.

The opposing substrate 501 is composed of transparent glass or another material, and is provided with banks 504 as barrier parts for partitioning the color regions as a plurality of pixel regions into a matrix on the surfaces that sandwich the liquid crystal, and three colors (RGB) of color layers 505R, 505G, 505B in the plurality of partitioned color regions. The banks 504 are composed of lower-layer banks 502 referred to as a black matrix that are composed of Cr or another metal or oxide film thereof that has light-blocking properties, and upper-layer banks 503 composed of an organic compound that are formed on (downward in the drawing) the lower-layer banks 502. The opposing substrate 501 is provided with an overcoat layer (OC layer) 506 as a planarizing layer for covering the color layers 505R, 505G, 505B that are partitioned by the bank 504 and the bank 504; and an opposing electrode 507 composed of ITO (Indium Tin Oxide) or another transparent conductive film that is formed so as to cover the OC layer 506. The color filters 505 are manufactured using the color filter manufacturing method described hereinafter.

The element substrate 508 is also composed of a glass or other transparent material, and has pixel electrodes 510 formed in a matrix via an insulation film 509 on the side on which the liquid crystals are sandwiched, and a plurality of TFT elements 511 formed so as to correspond to the pixel electrodes 510. Of the three terminals of the TFT elements 511, the other two terminals that are not connected to the pixel electrodes 510 are connected to scanning lines 512 and data lines 513 that are arranged in a lattice so as to surround and insulate the pixel electrodes 510 from each other.

The illumination device 516 may be any illumination device that uses a white LED, EL, cold cathode tube, or the like as a light source, and that has a structure provided with a light-guide plate, a diffusion plate, a reflection plate, or the like that is capable of emitting the light from the light source to the liquid crystal display panel 520.

Orientation films for aligning the liquid crystal molecules in one direction are formed on the surfaces of the opposing substrate 501 and the element substrate 508 that sandwich the liquid crystal, but the orientation films are not shown in the drawing. The upper and lower polarizers 514, 515 may also have phase difference films or other optically functional films that are used for such purposes as improving the viewing angle dependency. The liquid crystal display panel 520 is not limited to having TFT elements as the active elements, and may have a TFD (Thin Film Diode) element. When the liquid crystal display panel 520 is provided with a color filter on at least one of the substrates, the liquid crystal display panel 520 may be a passive liquid crystal display device in which the electrodes constituting the pixels are arranged so as to intersect each other.

The abovementioned liquid crystal display device 500 is manufactured by a process in which a structure formed by bonding the motherboard W in which the opposing substrate 501 provided with color filters 505 that has a plurality of partitions formed in a matrix therein with a motherboard in which the element substrate has a plurality of partitions formed in a matrix therein in the same manner so as to sandwich the liquid crystal, and cutting the assembly in a prescribed position to obtain the liquid crystal display device.

Color Filter Manufacturing Method

FIGS. 9A through 9E are schematic sectional views showing the color filter manufacturing process. The method for manufacturing the color filters 505 having three colors of color layers 505R, 505G, 505B such as described above is provided with a step for forming banks 504 on the surface of the opposing substrate 501, and a step for treating the surfaces of the color regions A that are partitioned by the banks 504. The manufacturing method is also provided with a drawing step for discharging droplets D of three types (three colors) of the liquid material that includes a color layer forming material in the surface-treated color regions A using the drawing system 1, and a film formation step as a curing step for drying the drawn liquid material to form color layers 505R, 505G, 505B. The manufacturing method is furthermore provided with a step for forming the OC layer 506 so as to cover the banks 504 and the color layers 505R, 505G, 505B, and a step for forming the transparent opposing electrode 507 that is composed of ITO so as to cover the OC layer 506.

Figure 9A:
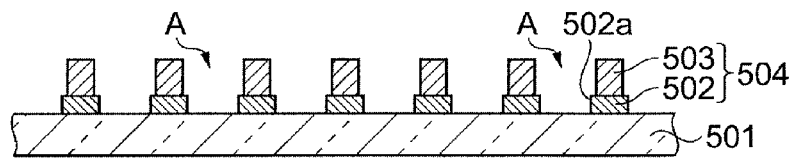
FIGS. 9A through 9E are schematic sectional views showing the color filter manufacturing method.

In the step for forming the banks 504, the lower-layer banks 502 as the black matrix are first formed on the opposing substrate 501, as shown in FIG. 9A. The material used to form the lower-layer banks 502 may be Cr, Ni, Al, or another non-transparent metal, or an oxide or other compound of these metals, for example. The lower-layer banks 502 are formed by a method in which a film composed of the abovementioned material is formed on the opposing substrate 501 using vapor deposition or sputtering. The film thickness may be set according to a material having an appointed film thickness that allows light-blocking properties to be maintained. For example, a thickness of 100 to 200 nm is preferred when the material is Cr. The film in areas other than the portions that correspond to the open parts 502a (see FIG. 8) is covered by a resist according to a photolithography method, and the film is etched using oxygen or another etching solution that corresponds to the abovementioned material. The lower-layer banks 502 having open parts 502a are thereby formed.

The upper-layer banks 503 are then formed on the lower-layer banks 502. An acrylic-based photosensitive resin material is used as the material for forming the upper-layer banks 503. The photosensitive resin material preferably has light-blocking properties. In an example of the method for forming the upper-layer banks 503, a photosensitive resin material is applied by roll coating or spin coating to the surface of the opposing substrate 501 on which the lower-layer banks 502 are formed, and the photosensitive resin material is dried to from a photosensitive resin layer having a thickness of about 2 µm. A mask provided with open parts that are sized according to the color regions A is then positioned opposite the opposing substrate 501 in a prescribed position, and exposure/development are performed to form the upper-layer banks 503. The banks 504 for partitioning the plurality of color regions A in a matrix are thereby formed on the opposing substrate 501. The process then proceeds to the surface treatment step.

In the surface treatment step, plasma treatment using $O_2$ as the treatment gas, and plasma treatment using a fluorine-based gas as the treatment gas are performed. Specifically, the color regions A are subjected to a lyophilizing treatment, and the surfaces of the upper-layer banks 503 (including the wall surfaces) composed of the photosensitive resin are then subjected to a fluid repellent treatment. The process then proceeds to the drawing step.

Figure 9B:
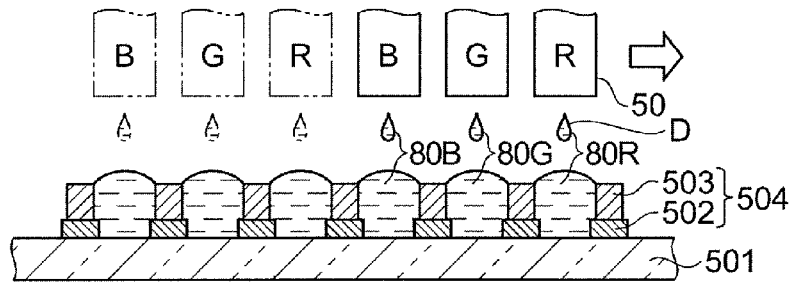

In the drawing step, droplets D of the liquid material 80R, 80G, 80B in the corresponding colors for the surface-treated color regions A are discharged as shown in FIG. 9B. The liquid material 80R includes R (red) color-filter-forming material, the liquid material 80G includes G (green) color-filter-forming material, and the liquid material 80B includes B (blue) color-filter-forming material. The liquid material 80R, 80G, 80B is filled into the droplet discharge heads 50 of the droplet discharge device 10. Primary scanning is then performed in which the head unit 9 and the motherboard W are moved relative to each other based on the arrangement information of the nozzles 52, and the liquid material 80R, 80G, 80B is discharged from the droplet discharge heads 50 to the color regions A. Since the liquid material 80R, 80G, 80B is discharged using the liquid material drawing method described hereinafter, the necessary quantity is provided according to the surface area of the color regions A.

Figure 9C:
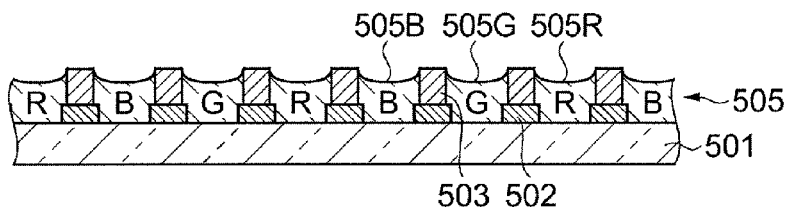

In the subsequent film formation step, the discharged and drawn liquid material 80R, 80G, 80B is dried at once to remove the solvent component, and films of the color layers 505R, 505G, 505B are formed, as shown in FIG. 9C. Vacuum drying or another method that is capable of uniformly drying the solvent components is preferred as the drying method. The process then proceeds to the OC layer formation step.

Figure 9D:
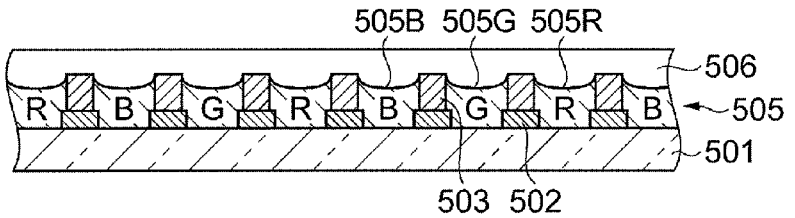

In the OC layer formation step, the OC layer 506 is formed so as to cover the upper-layer banks 503 and the color layers 505R, 505G, 505B, as shown in FIG. 9D. A transparent acrylic-based resin material may be used as the OC layer 506. Formation methods include spin coating, offset printing, and other methods. The OC layer 506 is provided to mitigate irregularities in the surface of the opposing substrate 501 on which the color layers 505R, 505G, 505B are formed, and to flatten the opposing electrode 507 that is subsequently formed as a film on the surface of the opposing substrate 501. A thin film of $SiO_2$ or the like may also be formed on the OC layer 506 to maintain adhesion with the opposing electrode 507. The process then proceeds to the transparent electrode formation step.

Figure 9E:
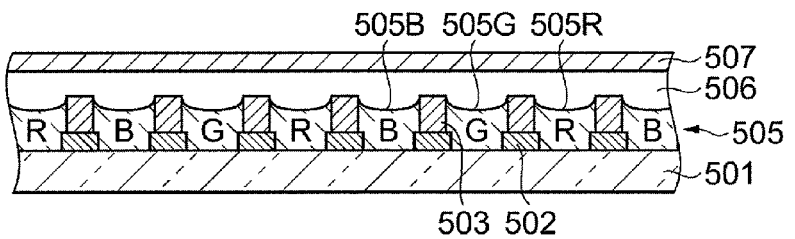

In the transparent electrode formation step, a film of ITO or another transparent electrode material is formed in a vacuum using sputtering or vapor deposition, and the opposing electrode 507 is formed on the entire surface so as to cover the OC layer 506, as shown in FIG. 9E.

In the abovementioned drawing step, the drawing system 1 is used to discharge and draw three different types of the liquid material 80R, 80G, 80B at substantially the same time. Stable discharge of the necessary quantity of the liquid material in the corresponding color region A is required in such a drawing method. For example, discharge irregularities occur in the color regions A when blockage of the nozzles 52 or fluctuation in the discharged quantity of droplets D occurs. When the droplets D discharged from the nozzles 52 do not land in the originally intended color region A due to flight deflection of the droplets, and a different liquid material lands in the color region A, different types of the liquid material mix together, and so-called mixing occurs. These discharge defects affect the product yield during manufacture of the color filters 505. In the liquid crystal display device 500, pixels that have color layers 505R, 505G, 505B in which discharge irregularity or mixing occurs have irregular color and other pixel defects. The occurrence of these discharge defects is therefore prevented to the fullest extent possible.

In the head unit 9, two droplet discharge heads 50 into which the liquid material is filled are provided for each type (color) of the liquid material, and droplets D of the same type of liquid material are discharged from a total of 360 nozzles 52. The flow of the motherboard W is stopped, and productivity during manufacturing of the color filters 505 is difficult to enhance when maintenance of the droplet discharge heads 50 is performed by the maintenance mechanism each time a discharge defect occurs in the droplets D. The liquid material drawing method of the present invention was developed in view of such a problem.

Liquid Material Drawing Method

The liquid material drawing method of the present embodiment will next be described based on FIGS. 10 through 14.

FIG. 10 is a flowchart showing the liquid material drawing method. As shown in FIG. 10, the liquid material drawing method of the present embodiment is provided with a step (step S1) for checking the landing state of droplets D that are discharged from the plurality of nozzles 52. A step (step S2) for writing the checking results obtained in the landing state checking step as nozzle information in the memory unit 14, and a step (step S3) for generating a pixel list that corresponds to defective nozzles included in the nozzle information are also provided. The liquid material drawing method is also provided with a step (step S4) for generating observation coordinates from the generated pixel list, a step (step S5) for discharging and drawing the liquid material on the motherboard W based on the arrangement information of the nozzles 52, and a step (step S6) for observing the discharged and drawn pixels. A step (step S7) for determining from the pixel observation results whether a defective pixel is present, and a correction step (step S8) for correcting the arrangement information when a defective pixel is detected are also provided.

Figure 11A:
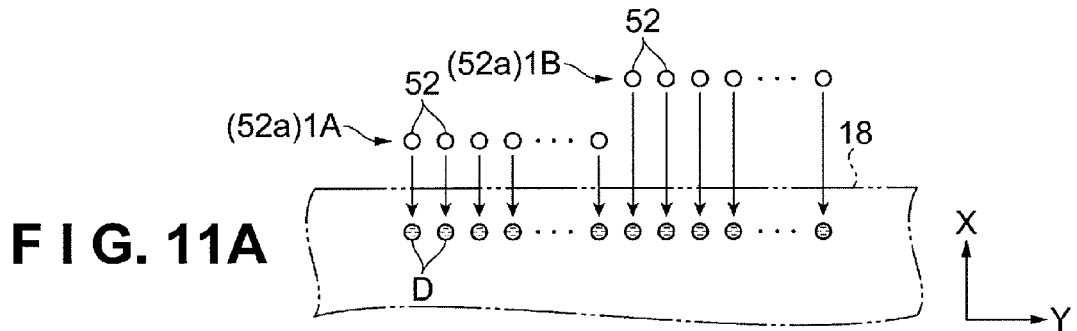
FIGS. 11A through 11D are schematic views showing the landing state checking step.

FIGS. 11A through 11D are schematic diagrams showing the landing state checking step. In the landing state checking step (step S1) shown in FIG. 10, a recording paper 18 as the landing observation discharge object is mounted on the setting table 5 (see FIG. 2) of the droplet discharge device 10 as shown in FIG. 11A. Droplets of the same type (same color) are discharged from the nozzles 52 of the droplet discharge heads 50 so as to land on an imaginary straight line in the Y-axis direction. Specifically, the control unit 4 moves the head unit 9 and the setting table 5 relative to each other, and varies the discharge timing of each nozzle row 52a so that the droplets are landed on the straight line in the primary scanning direction (X-axis direction). The landing state of the droplets D landed on the recording paper 18 is then observed using the camera 15. For example, droplets are discharged from nozzle row 1A and nozzle row 1B for discharging the red (R) liquid material 80R, and when there are no defects in the discharge state, the droplets D land on the straight line. When the discharged quantity of droplets D is substantially equal among the nozzles 52, the landing diameters of the landed droplets D are substantially the same.

Figure 11B:
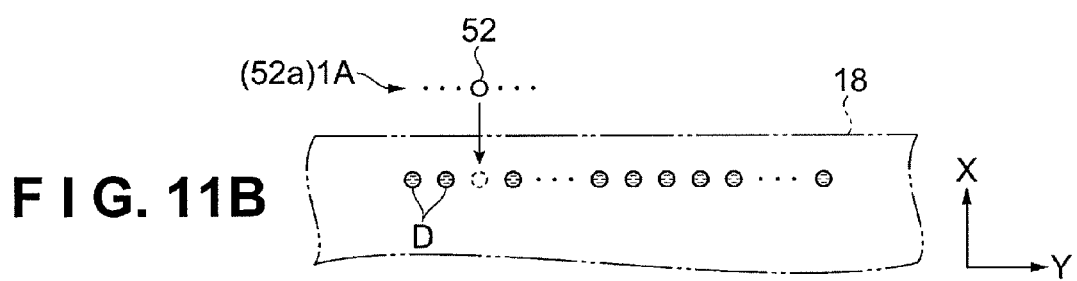

As shown in FIG. 11B, when blockage occurs in a certain nozzle 52 of nozzle row 1A, for example, the droplets D are not discharged. Specifically, a gap occurs in the landing of the droplets D on the recording paper 18, and a nozzle 52 in which missing discharge occurs (hereinafter referred to as a missing-discharge nozzle) can therefore be detected (identified).

Figure 11C:
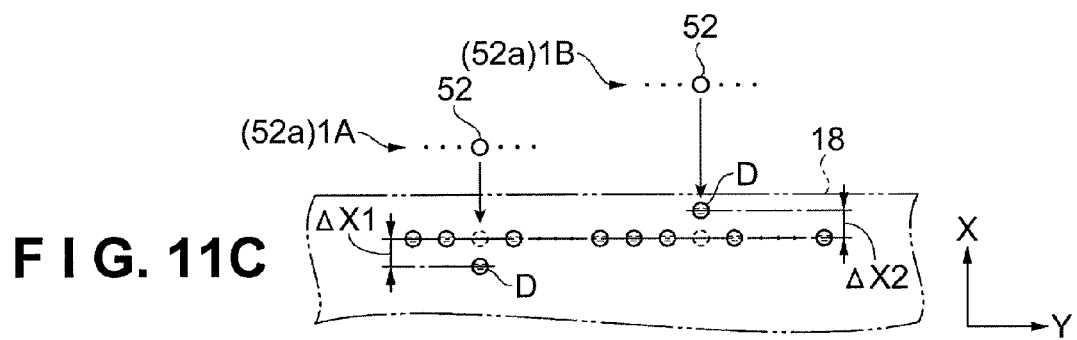

As shown in FIG. 11C, when a nozzle 52 in which flight deflection in the primary scanning direction occurs is present in nozzle row 1A and nozzle row 1B, for example, the discharged droplets D land in a position that is offset from the straight line. Such a landing state is imaged, and image processing is performed, whereby the CPU 41 can calculate deviation amounts ΔX1, ΔX2 and detect (identify) a nozzle 52 in which landing deviation occurs (hereinafter referred to as a landing-position-deviated nozzle). It is apparent that the landing position is not limited to the X-axis direction (primary scanning direction), and may be offset at an angle. The deviation amount is therefore computed as a deviation amount in the X-axis direction and a deviation amount in the Y-axis direction. The deviation amount in the landing position of droplets D discharged from nozzles 52 in which flight deflection occurs also varies according to the direction of relative movement between the droplet discharge heads 50 (plurality of nozzles 52) and the discharge object. Accordingly, the recording paper 18 is moved back and forth in the primary scanning direction with respect to the head unit 9 on which the droplet discharge heads 50 are mounted, and droplets D are discharged so as to land on different imaginary straight lines for positive and reverse movement, and the landing state is observed.

Figure 11D:
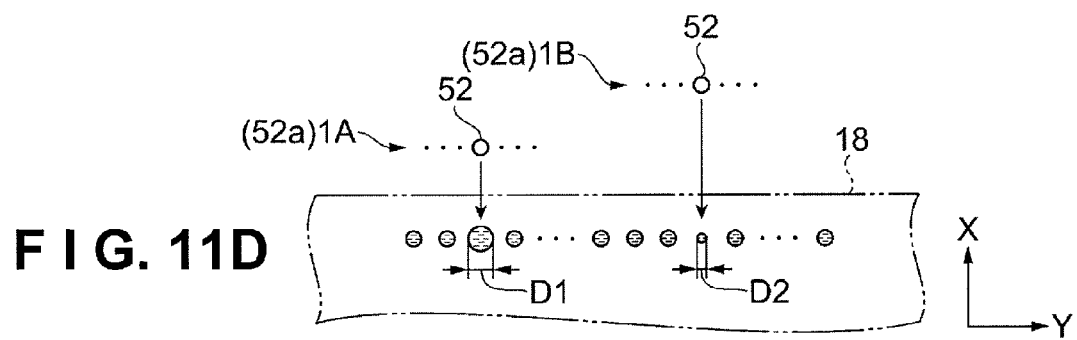

As shown in FIG. 11D, when a nozzle 52 for which the discharge quantity is excessive is present in nozzle row 1A, for example, the landing diameter D1 is too large. When a nozzle 52 for which the discharge quantity is too small is present in nozzle row 1B, the landing diameter D2 is too small. An abnormal discharge quantity nozzle can be detected (identified) by capturing an image of such a landing state and performing image processing. The process then proceeds to step S2.

In step S2 shown in FIG. 10, the upper-level computer 11 writes the information of missing-discharge nozzles, landing-position-deviated nozzles, and abnormal discharge quantity nozzles identified as defective nozzle in step S1 as nozzle information in the memory unit 14. The process then proceeds to step S3.

In step S3 shown in FIG. 10, the upper-level computer 11 reads the nozzle information stored in the memory unit 14 and generates a pixel list (in other words, a list of color regions A) of pixels with which a defective nozzle coincides during primary scanning. The process then proceeds to step S4.

In step S4 shown in FIG. 10, the upper-level computer 11 generates coordinates in which peripheral pixel regions A are added to at least the pixel region with which a defective nozzle coincides based on the nozzle information, the arrangement information of the nozzles 52, and the pixel list obtained in step S3. It is apparent that default observation coordinates that correspond to the arrangement of the nozzle rows 52a in primary scanning are generated when no defective nozzles are detected. The process then proceeds to step S5.

In step S5 shown in FIG. 10, the motherboard W is mounted in the droplet discharge device 10, the motherboard W and the head unit 9 are moved relative to each other, and droplets D of each type of liquid material 80R, 80G, 80B are discharged from the droplet discharge heads 50 to the plurality of color regions A.

FIG. 12 is a schematic plan view showing an example of the arrangement of droplets in the pixel regions. Specifically, FIG. 12A is a schematic plan view showing the arrangement of droplets during forward movement in primary scanning, and FIG. 12B is a schematic plan view showing the arrangement of droplets during reverse movement in primary scanning.

As shown in FIG. 12A, droplets D are discharged during relative movement of the head unit 9 and the motherboard W in the primary scanning direction (X-axis direction), and the droplets are arranged in the color regions A as pixel regions that are partitioned by the banks 504, for example. In this case, three discharges are performed in each of the color regions A with which the nozzles N1 through N3 of nozzle row 1A for discharging the red (R) liquid material 80R coincide during forward movement, and nine droplets D are arranged. The same applies for nozzles N4 through N6. As shown in FIG. 12B, during reverse movement, the head unit 9 is secondarily scanned, the position of nozzle row 1A is offset, three discharges are performed from each of the nozzles N1 and N2 that coincide with the color region A, and six more droplets D are arranged so as to land between the previously arranged droplets. Two primary scans are thereby performed to arrange a total of fifteen droplets D in the color region A. The same process is performed in the color regions A for the other colors (G, B). It is apparent that the number of nozzles 52 that coincide with the color regions A varies according to the size of the color region A and the arrangement thereof on the motherboard W, and the nozzle pitch of the nozzles 52 or the positioning of the nozzle rows 52a with respect to the color regions A.

FIGS. 12A and 12B show the arrangement of droplets D, and do not show the actual landing state. In other words, FIGS. 12A and 12B show the arrangement of the nozzles 52 that coincide with each color region A in forward movement and reverse movement of primary scanning.

FIG. 13A is a table showing the arrangement information of the nozzles, and FIG. 13B is a table showing the nozzle information. The arrangement of droplets shown in FIGS. 12A and 12B is based on the arrangement information of the nozzles 52 shown in FIG. 13A. The arrangement information includes information relating to the pixel number of the color region A, the nozzle number, the nozzle selection (1: selection; 0: non-selection), the number of discharges, the drive voltage, and the discharge timing. The information is divided into a forward movement scan 1 and a reverse movement scan 2. Such arrangement information is created in advance for the liquid material 80R, 80G, 80B, i.e., for each color. In the drive voltage, "1" indicates a case in which Vc and Vh shown in FIG. 7 have standard voltage settings. Since the discharge quantity of droplets D is varied by varying the voltage settings, different levels of voltage settings are linked to other numerical values. The reference discharge timing is also indicated as "1," and different discharge timing settings for increasing or decreasing the discharge timing are linked as other numerical values.

For example, the nozzle 52 whose nozzle number is "N3" that coincides with the color region A whose pixel number is "1R" is selected in the forward movement scan 1, and three discharges are performed at the standard drive voltage and discharge timing. In the reverse movement scan 2, the nozzle 52 coincides with the bank 504 as shown in FIG. 12B, and is therefore not selected.

As shown in FIG. 13B, the nozzle information in this case includes information relating to clogging of the nozzles 52, landing position (amount of deviation), and landing diameter. These items of information are obtained through the previous step S1 and stored in the memory unit 14. For example, a "1" is inputted to indicate the presence of the nozzle clogging, and a "0" is inputted to indicate the absence of nozzle clogging. The landing position is divided into deviation in the X-axis direction and deviation in the Y-axis direction, wherein "+" indicates deviation in the same direction as the scanning direction, and "−" indicates deviation in the opposite direction from the scanning direction. In this case, the amount of deviation is inputted in units (10 μm) of discharge resolution. For example, the discharged droplets D from the nozzle 52 whose nozzle number is "N3" land with a deviation of 40 μm in the primary scanning direction. The droplets D discharged from the nozzle 52 whose nozzle number is "N6" land with a deviation of 20 μm in the opposite direction from the primary scanning direction.

The landing diameter in this case is classified into two levels of overly large and overly small based on a case in which a prescribed quantity of droplets D are discharged. The levels are linked to levels for setting the drive voltage before varying the discharge quantity. Accordingly, the use of the two levels of overly large and overly small is not limiting, and the number of setting levels may be increased or decreased. The corresponding case is designated as "1," and the non-corresponding case is designated as "0." The case of "0" indicates a standard landing diameter.

Even when the liquid material is discharged and drawn based on such arrangement information of the nozzles 52, a defective pixel in which color irregularity or mixing occurs does not necessarily occur in the pixel of the color region A with which a nozzle 52 in which a discharge defect occurs coincides. A possible reason is that the positional accuracy of the color region A fluctuates due to expansion and contraction of the motherboard W or the positional accuracy of the formation of the banks 504, for example. Particularly in color filter manufacturing, there are pixels (colors) in which color irregularity or mixing is noticeable due to differences in sensitivity to each color. In step S6 shown in FIG. 10, a motherboard W is observed in which each liquid material 80R, 80G, 80B is actually discharged and drawn, and detection of defective pixels or identification of defective nozzles is thereby made reliable.

Figure 14:
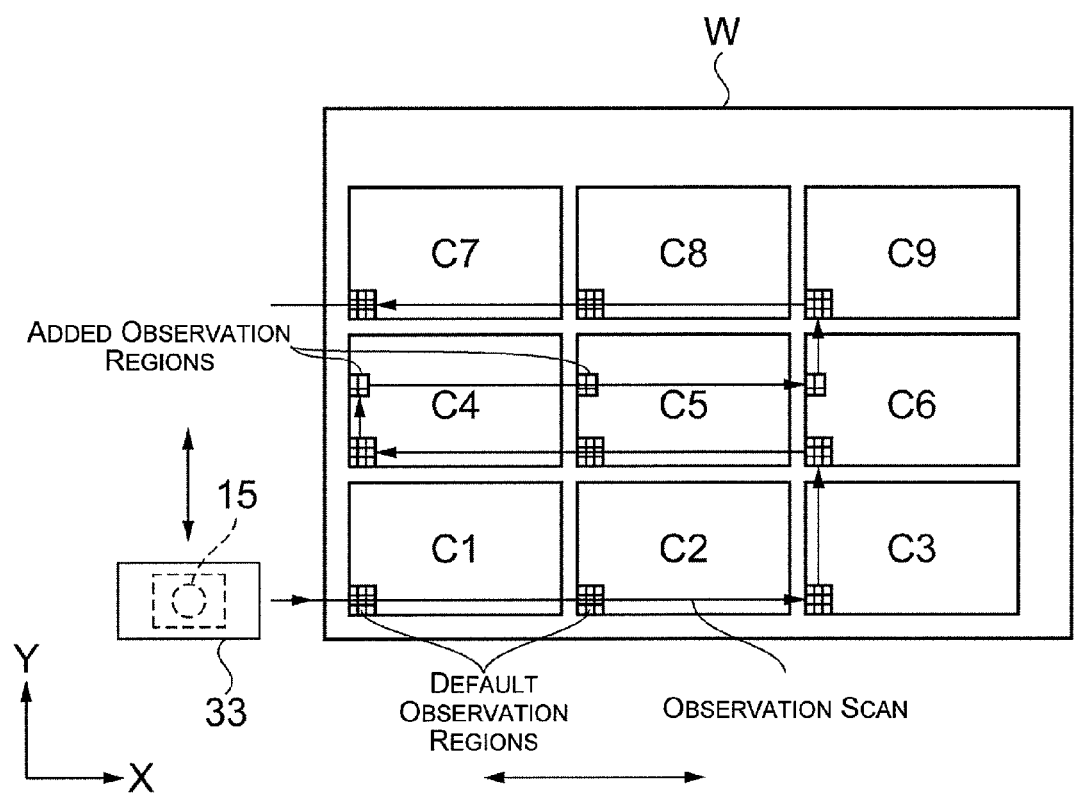
FIG. 14 is a schematic plan view showing the method for observing the pixel regions.

FIG. 14 is a schematic diagram showing the method for observing the pixel regions. In the motherboard W as shown in FIG. 14, the region in which a color filter 505 is arranged in a single liquid crystal display device 500, for example, is designated as a single chip region, and nine chip regions C1 through C9 are arranged in a matrix. Color regions A of the same color are arranged in stripes in the Y-axis direction in each chip region C1 through C9. In this case, the color regions A as pixel regions of the motherboard W are observed by a method in which the upper-level computer 11 generates default observation coordinates as well as information of defective nozzles in which discharge defects occur, and observation coordinates that are based on the arrangement information thereof. The observation coordinates, i.e., the observation region, is set for each chip region C1 through C9.

The upper-level computer 11 transmits a control signal to the control unit 4 to cause relative movement of the movement stage 33 and the motherboard W, and the camera 15 is moved to the observation region of each chip region C1 through C9. In this case, the default observation regions are observed in order starting from chip region C1 through chip regions C2, C3, C6, C5, and C4. Observation regions added to chip regions C4, C5, and C6 are then observed, the default observation regions are observed in the sequence of chip regions C9, C8, and C7, and the sequence of pixel observation steps is completed.

The observation method is not limited to the method described above, and when there is no information of defective nozzles, the three colors of color regions A with which the plurality of nozzles 52 coincides in at least one primary scan may be observed. When there is information of defective pixels, since there is a high probability that a defective pixel (color layer) will be formed due to a defective nozzle, only an added observation region based on the information of defective nozzles for chip regions C4, C5, and C6 may be observed. Such a configuration enables efficient and effective observation. The observation scanning route may be set based on the setting of the observation region to a route that enables efficient observation. The process then proceeds to step S7.

In step S7 in FIG. 10, a determination is made as to whether defective pixels are present in the observation regions of the chip regions C1 through C9. When defective pixels having color irregularity or mixing are present, the coordinates of the defective pixels are identified from the observation coordinates. The process then proceeds to step S8.

In step S8 shown in FIG. 10, a nozzle 52 that coincides with the defective pixel is identified from the information (defect details, coordinates) of the defective pixel, and the nozzle information is corrected to reflect the defective nozzle.

The arrangement information of the nozzles 52 is corrected by a method in which the defective nozzle is not selected, and other normal nozzles 52 are selected to discharge the missing droplets D. When color mixing occurs due to landing position deviation, the discharge timing is varied in the drive conditions so that the landing position of the droplets D discharged from the defective nozzle coincides with the original landing position. When color irregularity is caused by an abnormal discharge quantity nozzle in which the landing diameter is too large or too small, the setting of the drive voltage may be varied in the drive conditions. Furthermore, when there are multiple defective nozzles having different types of discharge defects in a single color region A, a combination of these methods may be used. Such correction is performed using the upper-level computer 11 to utilize the nozzle information and arrangement information stored in the memory unit 14.

When a defective nozzle is newly identified, the process returns to step S2, and the nozzle information is updated. Accordingly, step S2 also functions as a nozzle information updating step.

According to such a liquid material drawing method, even when not all of the color regions A as pixel regions are observed, observation based on the observation coordinates (observation region) generated by the upper-level computer 11 enables early discovery of defective pixels, and makes it possible to identify defective nozzles and accurately correct the arrangement information of nozzles 52 used for discharge and drawing.

The effects of the first embodiment are described below.

(1) In the pixel observation system 2 of the first embodiment, the landing state of droplets D discharged onto the recording paper 18 is observed/imaged by the camera 15 for forward movement and reverse movement, and clogged nozzles, landing-position-deviated nozzles, and abnormal discharge quantity nozzles are identified as defective nozzles. The information of the defective nozzles is stored as nozzle information in the memory unit 14. The upper-level computer 11 generates observation coordinates in which the coordinates of pixel regions (color regions A) with which the defective nozzles coincide are added to default observation coordinates based on the nozzle information and arrangement information of the nozzles 52 when the liquid material is actually discharged and drawn on the motherboard W. The camera 15 is used to observe/image the actually discharged and drawn motherboard W based on the observation coordinates. Since the probability is high that defective pixels will occur due to defective nozzles in which discharge defects occur, the defective pixels can be discovered early in comparison to a case in which all of the pixel regions are observed.

(2) The drawing system 1 of the abovementioned embodiment is provided with the abovementioned pixel observation system 2, the droplet discharge device 10, and a upper-level computer 11 for performing overall control of the pixel observation system 2 and the droplet discharge device 10. Therefore, defective pixels can be discovered early, the arrangement information of the nozzles 52 can be accurately corrected, and the necessary quantity of the liquid material for each pixel region (color region A) of the motherboard W can be discharged and drawn as droplets. Specifically, the nozzle information can be reflected to efficiently and effectively discharge and draw the liquid material.

(3) In the liquid material drawing method of the first embodiment, the drawing system 1 provided to the pixel observation system 2 is used to obtain the nozzle information in the landing state checking step. In the observation step, a pixel region (color region A) that is positioned at the observation coordinates generated based on the nozzle information and the arrangement information is observed to obtain the information of a defective pixel (defective color layer). In the correction step, a defective nozzle is newly identified from the obtained information of the defective pixel, and the arrangement information is corrected. The nozzle information is also updated based on the information of the identified defective nozzle. Consequently, the defective pixel is discovered early, the occurrence of defective pixels due to discharge defects can be reduced, and the necessary quantity of the liquid material for each pixel region (color region A) can be discharged and drawn as droplets.

(4) Since the color filter manufacturing method of the first embodiment uses the abovementioned liquid material drawing method, defective pixels can be discovered early, the occurrence of defective pixels due to discharge defects can be reduced, and the necessary quantity of the liquid material 80R, 80G, 80B can be discharged and drawn in the form of droplets D in each corresponding color region A. In the film formation step, color layers 505R, 505G, 505B having a substantially constant film thickness are obtained. Color filters 505 in which color irregularity or mixing is reduced can therefore be manufactured at high yield. When the opposing substrate 501 provided with the color filters 505 is used, a liquid crystal display device 500 having the desired optical characteristics can be obtained.

Second Embodiment

Referring now to FIGS. 15, 16A through 16F, a method for manufacturing an organic EL element having a luminescent layer in accordance with a second embodiment will now be explained. In view of the similarity between the first and second embodiments, the parts of the second embodiment that are identical to the parts of the first embodiment will be given the same reference numerals as the parts of the first embodiment. Moreover, the descriptions of the parts of the second embodiment that are identical to the parts of the first embodiment may be omitted for the sake of brevity.

In the method for manufacturing an organic EL element having a luminescent layer in accordance with the second embodiment, the drawing system 1 and the liquid material drawing method of the first embodiment as explained above are applied.

Figure 15:
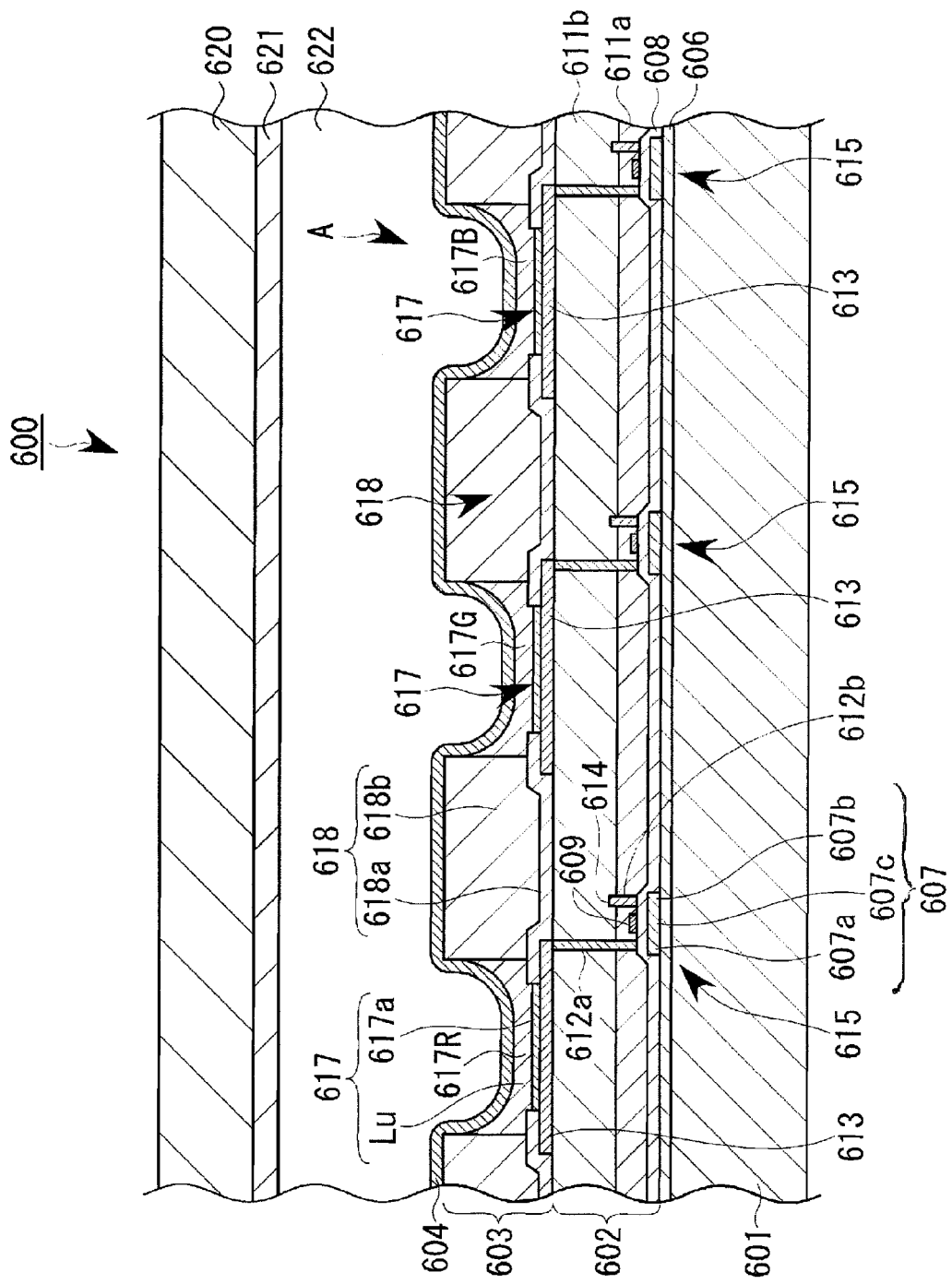
FIG. 15 is a schematic sectional view showing the relevant parts of the structure of the organic EL display device.

The organic EL display device having the organic EL element will first be briefly described. FIG. 15 is a schematic sectional view showing the relevant parts of the structure of the organic EL display device. As shown in FIG. 15, the organic EL display device 600 is provided with an element substrate 601 that has a luminescent element part 603 as the organic EL element; and a sealing substrate 620 that is sealed at a distance from the element substrate 601 and a space 622. The element substrate 601 is also provided with a circuit element part 602 on the element substrate 601, and the luminescent element part 603 is formed over the circuit element part 602 and driven by the circuit element part 602. Three colors of luminescent layers 617R, 617G, 617B are formed in luminescent layer formation regions A as pixel regions in a striped pattern in the luminescent element part 603. In the element substrate 601, three luminescent layer formation regions A that correspond to three colors of color layers 617R, 617G, 617B form a single set of picture elements, and the picture elements are arranged in a matrix on the circuit element part 602 of the element substrate 601. In the organic EL display device 600, the light emitted from the luminescent element part 603 is emitted toward the element substrate 601.

The sealing substrate 620 is composed of glass or metal, and is bonded to the element substrate 601 via a sealing resin. A getter agent 621 is affixed to the sealed inside surface. The getter agent 621 absorbs water or oxygen that enters the space 622 between the element substrate 601 and the sealing substrate 620 and prevents the luminescent element part 603 from being degraded by the contaminating water or oxygen. The getter agent 621 may also be omitted.

The element substrate 601 has a plurality of luminescent layer formation regions A as pixel regions on the circuit element part 602, and is provided with barrier parts 618 for partitioning the plurality of luminescent layer formation regions A; electrodes 613 formed in the plurality of luminescent layer formation regions A; and positive hole implantation/transport layers 617a that are layered on the electrodes 613. The luminescent element part 603 is also provided that has luminescent layers 617R, 617G, 617B formed by applying the three types of the liquid material that include a luminescent-layer-forming material in the plurality of luminescent layer formation regions A. The barrier parts 618 are composed of lower-layer banks 618a, and upper-layer banks 618b that essentially partition the luminescent layer formation regions A, wherein the lower-layer banks 618a are provided so as to protrude into the luminescent layer formation regions A, and the electrodes 613 and the luminescent layers 617R, 617G, 617B are formed by $SiO_2$ or another inorganic insulation material so as to prevent direct contact and electrical short circuiting with each other.

The element substrate 601 is composed of glass or another transparent substrate, for example, a base protective film 606 composed of a silicon oxide film is formed on the element substrate 601, and islands of semiconductor films 607 composed of polycrystalline silicon are formed on the base protective film 606. A source region 607a and a drain region 607b are formed by high-concentration P ion implantation in the semiconductor films 607. The portion into which P is not implanted is the channel region 607c. A transparent gate insulation film 608 for covering the base protective film 606 and the semiconductor films 607 is also formed, gate electrodes 609 composed of Al, Mo, Ta, Ti, W, or the like are formed on the gate insulation film 608, and a transparent first interlayer insulation film 611a and second interlayer insulation film 611b are formed on the gate electrodes 609 and the gate insulation film 608. The gate electrodes 609 are provided in positions that correspond to the channel regions 607c of the semiconductor films 607. Contact holes 612a, 612b that are connected to the source regions 607a and the drain regions 607b, respectively, of the semiconductor films 607 are also formed so as to penetrate through the first interlayer insulation film 611a and the second interlayer insulation film 611b. Transparent electrodes 613 composed of ITO (Indium Tin Oxide) are patterned in a prescribed shape and arranged (electrode formation step) on the second interlayer insulation film 611b, and the contact holes 612a on one side are connected to the electrodes 613. The other contact holes 612b are connected to power supply lines 614. Thin film transistors 615 for driving that are connected to the electrodes 613 are formed in the circuit element part 602 in this manner. Retention capacitors and thin film transistors for switching are also formed in the circuit element part 602, but these components are not shown in FIG. 15.

The luminescent element part 603 is provided with electrodes 613 as positive electrodes, positive hole implantation/transport layers 617a and the luminescent layers 617R, 617G, 617B (referred to generically as luminescent layers Lu) that are layered in sequence on the electrodes 613, and a negative electrode 604 that is layered so as to cover the upper-layer banks 618b and the luminescent layers Lu. A functional layer 617 in which luminescence is induced is composed of the positive hole implantation/transport layers 617a and the luminescent layers Lu. Using a transparent material to form the negative electrode 604, the sealing substrate 620, and the getter agent 621 enables the light generated from the direction of the sealing substrate 620 to be emitted.

The organic EL display device 600 has scanning lines (not shown) connected to the gate electrodes 609, and signal lines (not shown) connected to the source regions 607a, and when the thin film transistors (not shown) for switching are turned on by the scanning signal transmitted to the scanning lines, the potential of the signal lines at that time is maintained by retention capacitors, and the on/off state of the thin film transistors 615 for driving is determined according to the state of the retention capacitors. Electric current flows from the power supply lines 614 to the electrodes 613 via the channel regions 607c of the thin film transistors 615 for driving, and the electric current then flows to the negative electrode 604 via the positive hole implantation/transport layers 617a and the luminescent layers Lu. The luminescent layers Lu emit light according to the amount of flowing current. The organic EL display device 600 can display the desired characters or image through the light emission mechanism of the luminescent element part 603 thus configured.

Organic EL Element Manufacturing Method

The method for manufacturing a luminescent element part as the organic EL element of the present embodiment will next be described based on FIGS. 16A through 16F. FIGS. 16A through 16F are schematic sectional views showing the method for manufacturing a luminescent element part. The circuit element part 602 formed on the element substrate 601 is not shown in FIGS. 16A through 16F.

The method for manufacturing the luminescent element part 603 of the present embodiment is provided with a step for forming the electrodes 613 in positions that correspond to the plurality of luminescent layer formation regions A of the element substrate 601, and a barrier part formation step for forming the lower-layer banks 618a so as to partially overlap on the electrodes 613, and forming the upper-layer banks 618b on the lower-layer banks 618a so as to essentially partition the luminescent layer formation regions A. The manufacturing method is also provided with a step for performing surface treatment of the luminescent layer formation regions A that are partitioned by the upper-layer banks 618b, a step for applying the liquid material that includes a positive hole implantation/transport layer forming material in the surface-treated luminescent layer formation regions A to draw the positive hole implantation/transport layers 617a by discharging, and a step for drying the discharged liquid material to form the positive hole implantation/transport layers 617a. The manufacturing method is also provided with a step for performing surface treatment of the luminescent layer formation regions A in which the positive hole implantation/transport layers 617a are formed, a drawing step for discharging and drawing three types of the liquid material that includes the luminescent layer forming material in the surface-treated luminescent layer formation regions A, and a curing step for drying the discharged three types of the liquid material to form the luminescent layers Lu. The manufacturing method is furthermore provided with a step for forming the negative electrode 604 so as to cover the upper-layer banks 618b and the luminescent layers Lu.

Figure 16A:
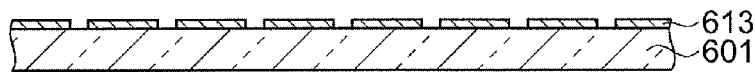
FIGS. 16A through 16F are schematic sectional views showing the method for manufacturing a luminescent element part as the organic EL element.

In the electrode (positive electrode) formation step, the electrodes 613 are formed in positions that correspond to the luminescent layer formation regions A of the element substrate 601 on which the circuit element part 602 is already formed, as shown in FIG. 16A. In an example of the formation method, a transparent electrode film is formed on the surface of the element substrate 601 by sputtering or vapor deposition in a vacuum using ITO or another transparent electrode material. A photolithography method is then used to leave only the necessary portion, and the electrodes 613 may be formed by etching. The element substrate 601 is covered in advance by a photoresist, and exposure/development are performed so as to open the regions for forming the electrodes 613. A transparent electrode film of ITO or the like may then be formed in the open parts, and the remaining photoresist may be removed. The process then proceeds to the barrier part formation step.

Figure 16B:
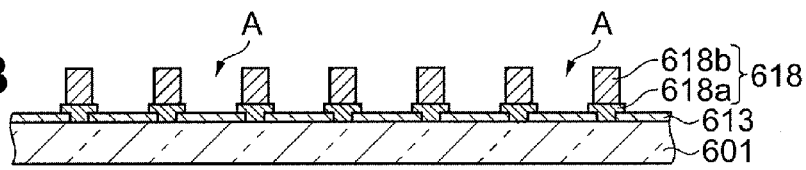

In the barrier part formation step, the lower-layer banks 618a are formed so as to cover portions of the plurality of electrodes 613 of the element substrate 601, as shown in FIG. 16B. The material used to form the lower-layer banks 618a is $SiO_2$ (silicon dioxide), which is an inorganic material having insulation properties. In an example of the method for forming the lower-layer banks 618a, the surfaces of the electrodes 613 are masked using a resist or the like so as to correspond to the subsequently formed luminescent layers Lu. The masked element substrate 601 is then placed in a vacuum device, and the lower-layer banks 618a are formed by sputtering or vacuum deposition using $SiO_2$ as the target or source material. The resist or other mask is subsequently peeled off. Since the lower-layer banks 618a are formed by $SiO_2$, adequate transparency is obtained when the film thickness thereof is 200 nm or less, and light emission is not inhibited even when the positive hole implantation/transport layers 617a and the luminescent layers Lu are subsequently layered.

The upper-layer banks 618b are then formed on the lower-layer banks 618a so as to essentially partition the luminescent layer formation regions A. The material used to form the upper-layer banks 618b is preferably a material that is durable with respect to the solvent of the three types of liquid material 100R, 100G, 100B that include the luminescent layer forming material described hereinafter, and a material that can be given a fluid-repellent treatment through the use of a plasma treatment using a fluorine-based gas as the treatment gas is preferred, e.g., an organic material such as an acrylic resin, an epoxy resin, a photosensitive polyimide, or the like. In an example of the method for forming the upper-layer banks 618b, the abovementioned photosensitive organic material is applied by roll coating or spin coating to the surface of the element substrate 601 on which the lower-layer banks 618a are formed, and the coating is dried to form a photosensitive resin layer having a thickness of about 2 μm. A mask provided with open parts whose size corresponds to the luminescent layer formation regions A is then placed against the element substrate 601 in a prescribed position, and exposure/development is performed, whereby the upper-layer banks 618b are formed. The barrier parts 618 having lower-layer banks 618a and upper-layer banks 618b are thereby formed. The process then proceeds to the surface treatment step.

In the step for treating the surfaces of the luminescent layer formation regions A, the surface of the element substrate 601 on which the barrier parts 618 are formed is first plasma treated using $O_2$ gas as the treatment gas. The surfaces of the electrodes 613, the protruding parts of the lower-layer banks 618a, and the surfaces (including the wall surfaces) of the upper-layer banks 618b are thereby activated and lyophilized. Plasma treatment is then performed using $CF_4$ or another fluorine-based gas as the treatment gas. The fluorine-based gas is thereby reacted with only the surfaces of the upper-layer banks 618b that are composed of the photosensitive resin as an organic material, and the surfaces are rendered fluid repellent. The process then proceeds to the positive hole implantation/transport layer formation step.

Figure 16C:
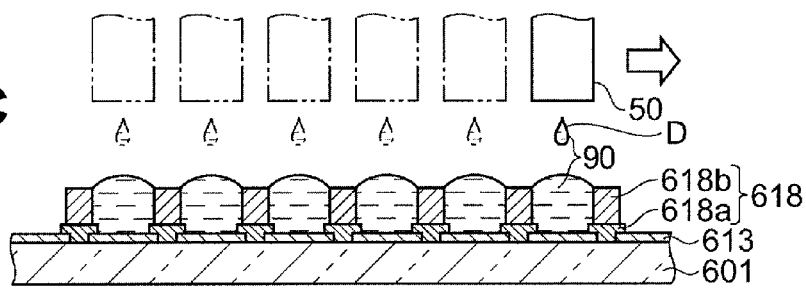

In the positive hole implantation/transport layer formation step, a liquid material 90 that includes a positive hole implantation/transport layer forming material is applied in the positive hole implantation/transport layer formation regions A, as shown in FIG. 16C. The drawing system 1 shown in FIG. 1 is used as the method for applying the liquid material 90. The liquid material 90 discharged from the droplet discharge heads 50 lands as droplets on the electrodes 613 of the element substrate 601 and spreads. The necessary amount of the liquid material 90 according to the surface area of the luminescent layer formation regions A is discharged as droplets. The process then proceeds to the drying/film-formation step.

In the drying/film-formation step, the solvent component of the liquid material 90 is dried and removed by heating the element substrate 601 by a lamp annealing method or other method, for example, and the positive hole implantation/transport layers 617a are formed in the regions partitioned by the lower-layer banks 618a of the electrodes 613. In the present embodiment, PEDOT (Polyethylene Dioxy Thiophene) is used as the positive hole implantation/transport layer forming material. Positive hole implantation/transport layers 617a composed of the same material are formed in the luminescent layer formation regions A in this case, but the material for forming the positive hole implantation/transport layers 617a may also be varied for each luminescent layer formation region A according to the subsequently formed luminescent layers Lu. The process then proceeds to the surface treatment step.

In the surface treatment step, when the positive hole implantation/transport layers 617a are formed using the abovementioned positive hole implantation/transport layer forming material, since the surfaces thereof repel the three types of liquid material 100R, 100G, 100B, a surface treatment is again performed so that at least the areas within the luminescent layer formation regions A are lyophilic. The surface treatment is performed by a method in which the solvent used in the three types of liquid material 100R, 100G, 100B is applied and dried. A spraying method, a spin coating method, or other method may be used to apply the solvent. The process then proceeds to the luminescent layer Lu drawing step.

Figure 16D:
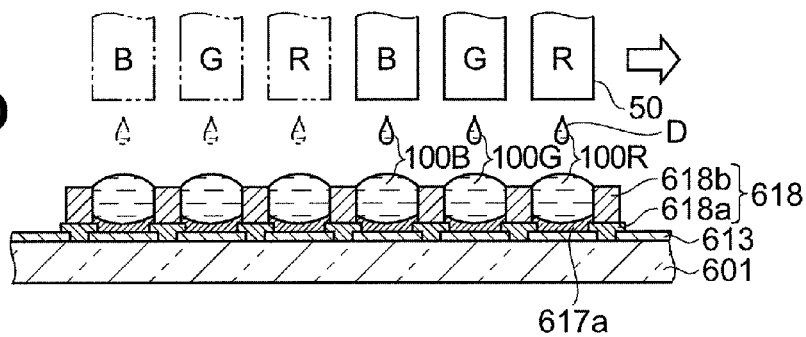

In the luminescent layer 617B drawing step, the drawing system 1 is used to apply the three types of liquid material 100R, 100G, 100B including the luminescent layer forming material from the plurality of droplet discharge heads 50 to the plurality of luminescent layer formation regions A, as shown in FIG. 16D. The liquid material 100R includes a material for forming the luminescent layers 617R (red), the liquid material 100G includes a material for forming the luminescent layers 617G (green), and the liquid material 100B includes a material for forming the luminescent layers 617B (blue). The liquid bodies 100R, 100G, 100B are applied in the luminescent layer formation regions A using the liquid material drawing method of the first embodiment. In this case, it is difficult to distinguish between the colors of the liquid bodies 100R, 100G, 100B. Therefore, an illumination device that emits ultraviolet rays is used as a method for observing the landing state of the droplets using the camera 15. The landed droplets are thereby excited by the ultraviolet rays so as to emit light, and the landing state can therefore be observed and imaged. The nozzle information of a plurality of nozzles 52 is obtained in the landing state checking step, and the luminescent layer formation regions A (pixel regions) are observed that are positioned at the observation coordinates generated based on the nozzle information and the arrangement information of the nozzles 52. The occurrence of discharge defects is thereby reduced, and the necessary quantities of the liquid bodies 100R, 100G, 100B are discharged and drawn as droplets in the corresponding luminescent layer formation regions A. The process then proceeds to the curing step.

Figure 16E:
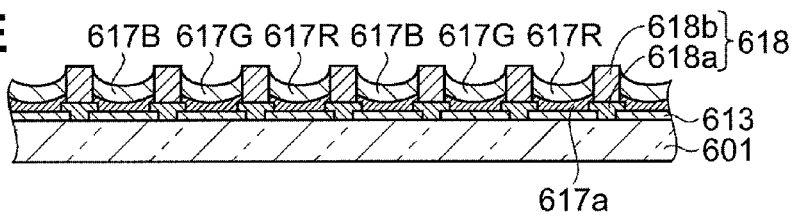

In the curing step, the solvent component of the discharged and drawn liquid bodies 100R, 100G, 100B is dried and removed, and films are formed so that the luminescent layers 617R, 617G, 617B are layered on the positive hole implantation/transport layers 617a of the luminescent layer formation regions A, as shown in FIG. 16E. A vacuum drying method that enables the solvent to be evaporated at a substantially constant rate is preferred as the method for drying the element substrate 601 on which the liquid bodies 100R, 100G, 100B are discharged and drawn. The process then proceeds to the negative electrode formation step.

Figure 16F:
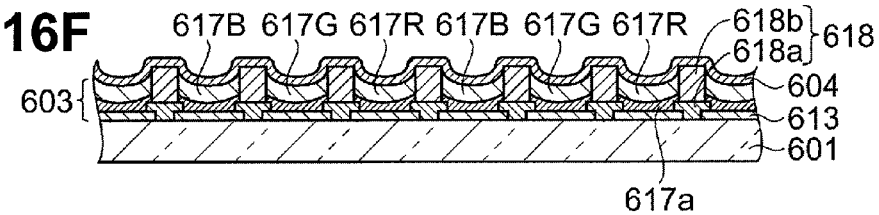

In the negative electrode formation step, the negative electrode 604 is formed so as to cover the upper-layer banks 618b and the luminescent layers 617R, 617G, 617B of the element substrate 601, as shown in FIG. 16F. A combination of Ca, Ba, Al, or another metal and LiF or another fluoride is preferably used as the material for forming the negative electrode 604. It is particularly preferred that a film of Ca, Ba, or LiF having a small work function be formed on the side towards the luminescent layers 617R, 617G, 617B, and that a film of Al or the like having a large work function be formed on the side facing away from the luminescent layers. A protective layer of $SiO_2$, SiN, or the like may also be layered on the negative electrode 604. The negative electrode 604 can thereby be prevented from oxidizing. Methods used to form the negative electrode 604 include vapor deposition, sputtering, CVD, and other methods. Vapor deposition is particularly preferred, since this method makes it possible to prevent the luminescent layers 617R, 617G, 617B from being damaged by heat.

The element substrate 601 completed in this manner has luminescent layers 617R, 617G, 617B in which the necessary quantities of the liquid bodies 100R, 100G, 100B are applied in the corresponding luminescent layer formation regions A, and that have a substantially constant thickness after film formation.

The effects of the second embodiment are as described below.

(1) In the method for manufacturing the luminescent element part 603 according to the second embodiment, in the drawing step for the luminescent layers Lu, the necessary quantities of the liquid bodies 100R, 100G, 100B are discharged and drawn in the form of droplets D in the luminescent layer formation regions A of the element substrate 601 using the drawing system 1 and the liquid material drawing method of the first embodiment. Consequently, a luminescent element part 603 having luminescent layers 617R, 617G, 617B in which the film thickness after film formation is substantially constant can be manufactured at high yield and with high productivity.

(2) When the element substrate 601 is used that is manufactured using the method for manufacturing the luminescent element part 603 according to the second embodiment, the thickness of the luminescent layers 617R, 617G, 617B is substantially constant, and the resistance of each luminescent layer 617R, 617G, 617B is therefore substantially constant. Uneven luminescence, uneven luminance, and other defects due to unequal resistance in each luminescent layer 617R, 617G, 617B is thereby reduced when the drive voltage is applied by the circuit element part 602 to the luminescent element part 603 to generate light. Specifically, an organic EL display device 600 can be provided that has attractive display quality and a minimal occurrence of uneven luminescence, uneven luminance, and other defects due to uneven discharge caused by flight deflection.

The first and second embodiments of the present invention were described above, but various modifications may be added to the embodiments described above in ranges that do not depart from the intended scope of the present invention. Examples of modifications other than the abovementioned embodiments are described below.

MODIFICATION EXAMPLE 1

In the drawing system 1 of the first embodiment, the structure of the pixel observation system 2 is not limited as such. For example, a configuration may be adopted in which a plurality of cameras 15 is provided according to the size of the motherboard W or the number of chip regions. This configuration enables more rapid observation. A configuration may also be adopted in which the camera 15 is not mounted on the movement stage 33 of the head movement mechanism 30, and the camera 15 is provided so as to be capable of moving in the Y-axis direction.

MODIFICATION EXAMPLE 2

In the drawing system 1 and the liquid material drawing method of the first embodiment, the method for landing the droplets D on the recording paper 18 is not limited to a method in which the recording paper 18 is mounted on the setting table 5. For example, a separate table for mounting the recording paper 18 in the Y-axis direction may be provided, and the table may be capable of moving in the X-axis direction. This configuration makes it possible to discharge droplets D onto the recording paper 18 in conjunction with discharging and drawing on the motherboard W.

MODIFICATION EXAMPLE 3

The liquid material drawing method of the first embodiment is not limited as such. For example, the landing state checking step (step S1) need not be performed each time a single motherboard W is processed. The landing state checking step may be performed for a single manufacturing lot of a plurality of motherboards W, at the start of or during operation, after maintenance of the droplet discharge heads 50 by the maintenance mechanism, periodically, or at another time. Production efficiency can be further enhanced.

MODIFICATION EXAMPLE 4

In the color filter manufacturing method of the first embodiment, and the organic EL element manufacturing method of the second embodiment, the arrangement of the color regions A and the luminescent layer formation regions A is not limited to a striped arrangement. The liquid material drawing method of the first embodiment can be applied to a delta arrangement or a mosaic arrangement. The configuration having three colors of color layers 505R, 505G, 505B is also not limiting, and the present invention can also be applied in a method for manufacturing a multicolor color filter in which other colors besides the RGB colors are combined.

MODIFICATION EXAMPLE 5

Device manufacturing methods in which the liquid material drawing method of the first embodiment can be applied are not limited to a color filter manufacturing method and an organic EL element manufacturing method. For example, the liquid material drawing method of the first embodiment can also be applied to a pixel electrode manufacturing method or a method for manufacturing a switching element that is formed in each pixel region in the liquid crystal display device 500 shown in FIG. 8, or the organic EL display device 600 shown in FIG. 15.

General Interpretation of Terms

In understanding the scope of the present invention, the term "configured" as used herein to describe a component, section or part of a device includes hardware and/or software that is constructed and/or programmed to carry out the desired function. In understanding the scope of the present invention, the term "comprising" and its derivatives, as used herein, are intended to be open ended terms that specify the presence of the stated features, elements, components, groups, integers, and/or steps, but do not exclude the presence of other unstated features, elements, components, groups, integers and/or steps. The foregoing also applies to words having similar meanings such as the terms, "including", "having" and their derivatives. Also, the terms "part," "section," "portion," "member" or "element" when used in the singular can have the dual meaning of a single part or a plurality of parts.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents.

What is claimed is:

1. A liquid material drawing method for discharging a liquid material including a functional material from a plurality of nozzles to a plurality of pixel regions on a substrate in synchronization with relative movement of the substrate and the nozzles to form a plurality of pixels, the liquid material drawing method comprising:

discharging from the nozzles droplets of the liquid material onto a test discharge object which is different from the substrate;

checking discharge states of the liquid material on the test discharge object;

storing nozzle information indicative of the discharge states of the liquid material, the nozzle information including information of a defective nozzle in which a discharge defect occurs;

generating a pixel list indicative of each of the pixel regions corresponding to the defective nozzle based on the nozzle information;

generating observation coordinates indicating observation regions to be observed in the pixel regions on the substrate based on the pixel list and arrangement information indicative of an arrangement of each of the nozzles with respect to each of the pixel regions in the relative movement;

discharging and drawing droplets of the liquid material in the pixel regions on the substrate from the nozzles based on the arrangement information;

observing the observation regions in the pixel regions positioned at the observation coordinates of the substrate after the liquid material is discharged and drawn on the substrate;

identifying a defective nozzle corresponding to a defective pixel among the pixel regions; and correcting the arrangement information when the defective pixel is detected, the generating of the observation coordinates including generating coordinates of at least some of the pixel regions over which the nozzles scan through one cycle of the relative movement as the observation coordinates.

2. The liquid material drawing method according to claim 1, further comprising
updating the nozzle information based on information of the defective nozzle identified.

3. The liquid material drawing method according to claim 1, wherein
the generating of the observation coordinates includes generating coordinates of the pixel region corresponding to the defective nozzle and the pixel regions disposed adjacent to the pixel region corresponding to the defective nozzle as the observation coordinates.

4. The liquid material drawing method according to claim 1, wherein
the identifying of the defective nozzle includes identifying at least one of a clogged nozzle, a landing-position-deviated nozzle, and an abnormal discharge quantity nozzle as the defective nozzle.

5. The liquid material drawing method according to claim 1, further comprising
discharging droplets of the liquid material onto a test discharge object from the nozzles, and
measuring a landing diameter and a landing position deviation of the droplets discharged onto the test discharge object,
the generating of the observation coordinates including generating the observation coordinates based on the nozzle information including dimensional information of the nozzles indicative of the landing diameter and the landing position deviation.

6. The liquid material drawing method according to claim 5, wherein
the discharging of the droplets includes discharging the droplets while the nozzles and the test discharge object are moved relative to each other so that the droplets are landed on an imaginary straight line in each of a forward movement and a reverse movement of a relative movement of the nozzles and the test discharge object.

7. The liquid material drawing method according to claim 1, wherein
the arrangement information includes selection information of a nozzle for discharging the droplets, and
the correcting of the arrangement information includes correcting the arrangement information so that the defective nozzle is not selected, and one of the nozzles other than the defective nozzle is selected to discharge the liquid material to make up for a deficiency in the liquid material discharged onto each of the pixel regions.

8. The liquid material drawing method according to claim 1, wherein
the arrangement information includes a drive condition for discharging the droplets for each of the nozzles, and
the correcting of the arrangement information includes identifying one of a landing-position-deviated nozzle and an abnormal discharge quantity nozzle as the defective nozzle, and varying the drive condition for discharging the droplets from the defective nozzle.

9. A method for manufacturing a color filter having at least three colors of color layers in the pixel regions partitioned on the substrate, the color filter manufacturing method comprising:
- performing the liquid material drawing method according to claim 1 to discharge and draw at least three colors of the liquid material in the pixel regions with the liquid material including a color layer formation material; and
- curing the liquid material discharged and drawn on the substrate to form the at least three colors of the color layers.

10. A method for manufacturing an organic EL element having at least a luminescent layer in the pixel regions partitioned on the substrate, the organic EL manufacturing method comprising:
- performing the liquid material drawing method according to claim 1 to discharge and draw the liquid material including a luminescent layer formation material in the pixel regions; and
- curing the liquid material discharged and drawn on the substrate to form the luminescent layer.

* * * * *